US011342262B2

(12) United States Patent
Kim et al.

(10) Patent No.: US 11,342,262 B2
(45) Date of Patent: May 24, 2022

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 67 days.

(21) Appl. No.: 17/063,236

(22) Filed: Oct. 5, 2020

(65) Prior Publication Data
US 2021/0351128 A1   Nov. 11, 2021

(30) Foreign Application Priority Data
May 7, 2020   (KR) .................. 10-2020-0054732

(51) Int. Cl.
*H01L 23/522* (2006.01)
*H01L 23/535* (2006.01)
*H01L 49/02* (2006.01)
*H01L 27/11556* (2017.01)
*H01L 21/768* (2006.01)
*H01L 45/00* (2006.01)
*H01L 27/24* (2006.01)
*H01L 27/11582* (2017.01)

(52) U.S. Cl.
CPC .... *H01L 23/5228* (2013.01); *H01L 21/76805* (2013.01); *H01L 21/76895* (2013.01); *H01L 23/535* (2013.01); *H01L 27/11556* (2013.01); *H01L 27/11582* (2013.01); *H01L 27/249* (2013.01); *H01L 27/2454* (2013.01); *H01L 28/24* (2013.01); *H01L 45/06* (2013.01)

(58) Field of Classification Search
None
See application file for complete search history.

(56) References Cited

U.S. PATENT DOCUMENTS

| 9,941,297 B2 | 4/2018 | Nishikawa et al. |
| 2020/0273881 A1* | 8/2020 | Kim .................. H01L 27/11573 |

FOREIGN PATENT DOCUMENTS

KR   1020170086347 A   7/2017

\* cited by examiner

*Primary Examiner* — Hsien Ming Lee
(74) *Attorney, Agent, or Firm* — William Park & Associates Ltd.

(57) ABSTRACT

The present disclosure includes a semiconductor memory device and a method of manufacturing the semiconductor memory device. The semiconductor memory device includes an insulating film passing through a dummy source structure, a first dummy stack extending to overlap the insulating film and the dummy source structure, and including a depression overlapping the insulating film, a resistive film overlapping the depression of the first dummy stack, and a second dummy stack disposed on the first dummy stack to cover the resistive film.

19 Claims, 22 Drawing Sheets

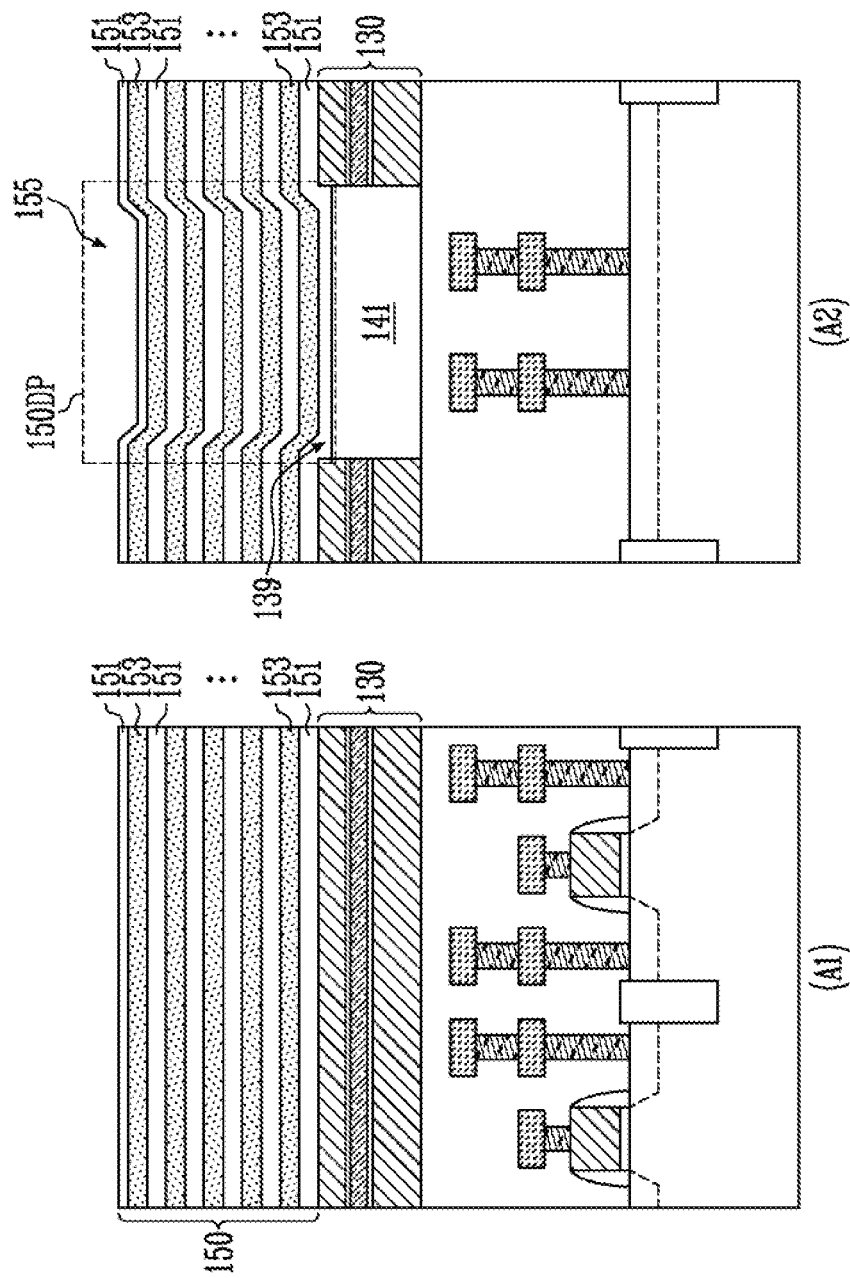

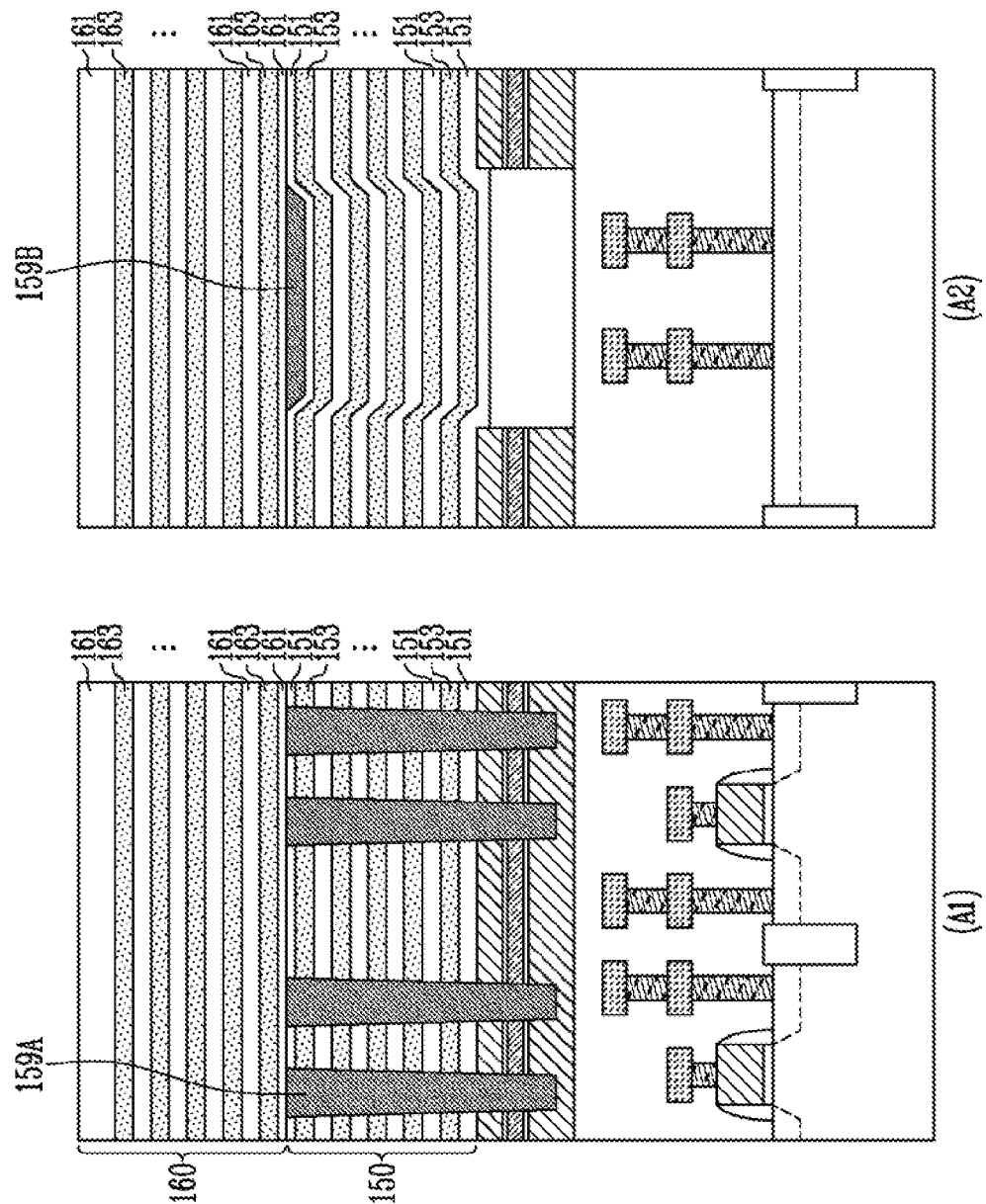

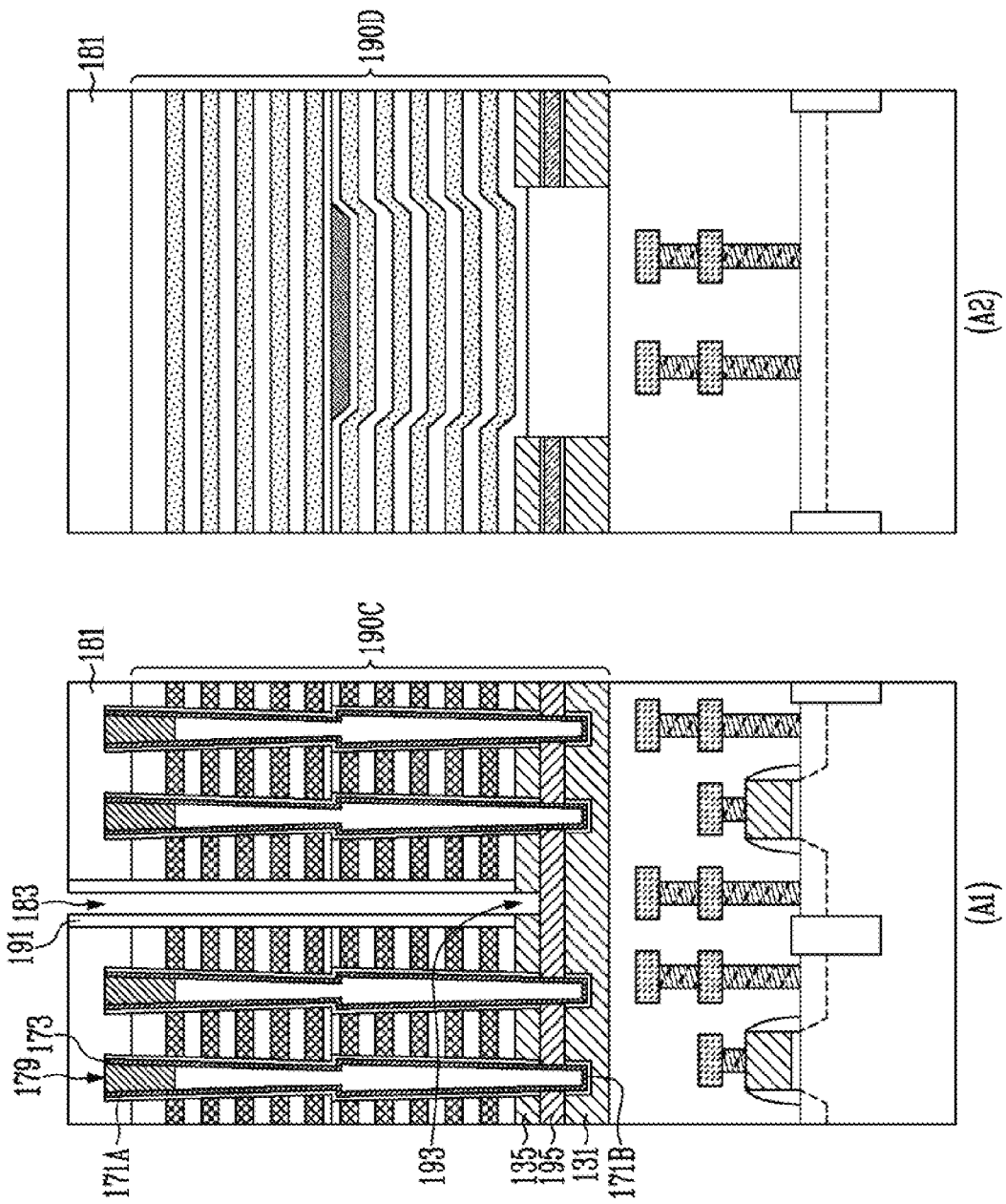

FIG. 6N
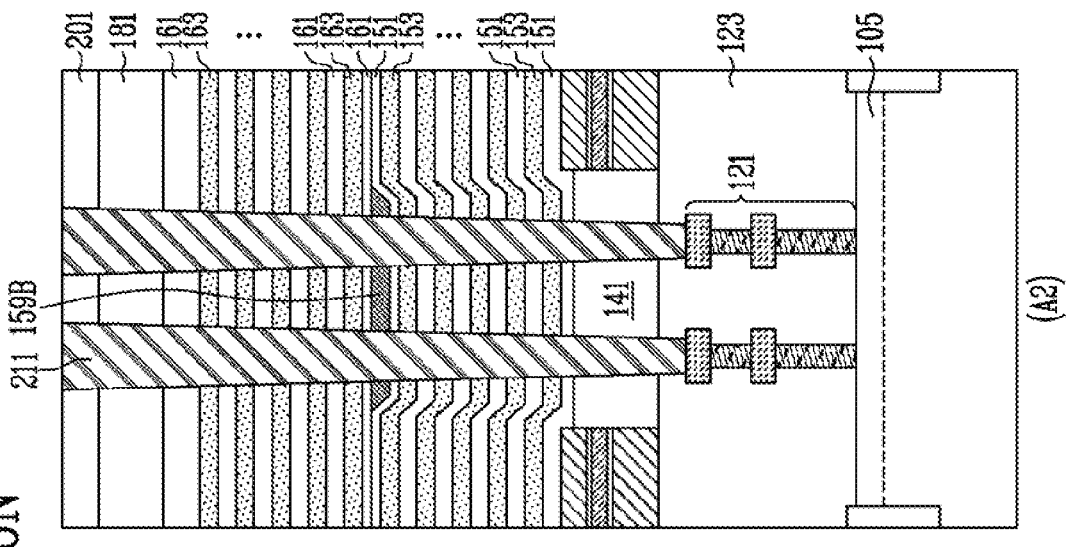
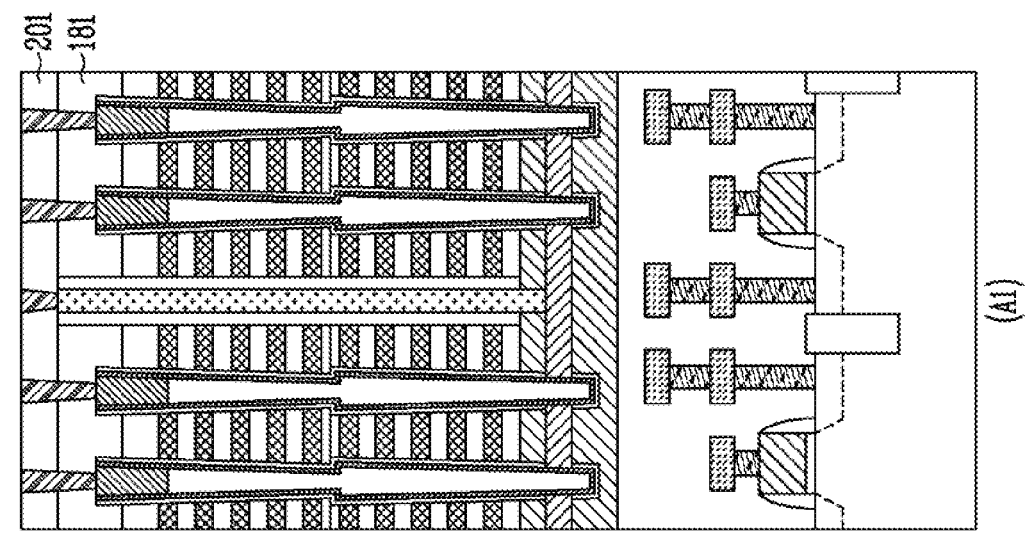

SEMICONDUCTOR MEMORY DEVICE AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2020-0054732 filed on May 7, 2020, in the Korean Intellectual Property Office, the entire disclosure of which is incorporated by reference herein.

BACKGROUND

1. Technical Field

The present disclosure relates to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device includes memory cells capable of storing data. Voltages for an operation of the semiconductor memory device may be controlled to a desired level through resistors.

A three-dimensional semiconductor memory device includes memory cells arranged in a three dimension. Accordingly, the three-dimensional semiconductor memory device may reduce the occupied area of the memory cells on a substrate.

SUMMARY

A semiconductor memory device according to an embodiment of the present disclosure may include an insulating film passing through a dummy source structure, a first dummy stack extending to overlap the insulating film and the dummy source structure, and including a depression overlapping the insulating film, a resistive film overlapping the depression of the first dummy stack, and a second dummy stack disposed on the first dummy stack to cover the resistive film.

A method of manufacturing a semiconductor memory device according to an embodiment of the present disclosure may include forming a preliminary source structure over a substrate including a first area and a second area, forming an opening passing through a portion of the preliminary source structure overlapping the second area, forming an insulating film in the opening, forming a first stack extending to overlap the insulating film and the preliminary source structure, and having a depression overlapping the insulating film, forming a resistive film overlapping the depression of the first stack, and forming a second stack on the first stack to cover the resistive film.

BRIEF DESCRIPTION OF THE DRAWINGS

FIGS. 6A, 6B, 6C, 6D, 6E, 6F, 6G, 6H, 6I, 6J, 6K, 6L, 6M, and 6N are cross-sectional views illustrating a method of manufacturing a semiconductor memory device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as limited to the embodiments described in the present specification or application.

Embodiments of the present disclosure provide a semiconductor memory device including resistors, and a method of manufacturing the semiconductor memory device.

Figure 1:
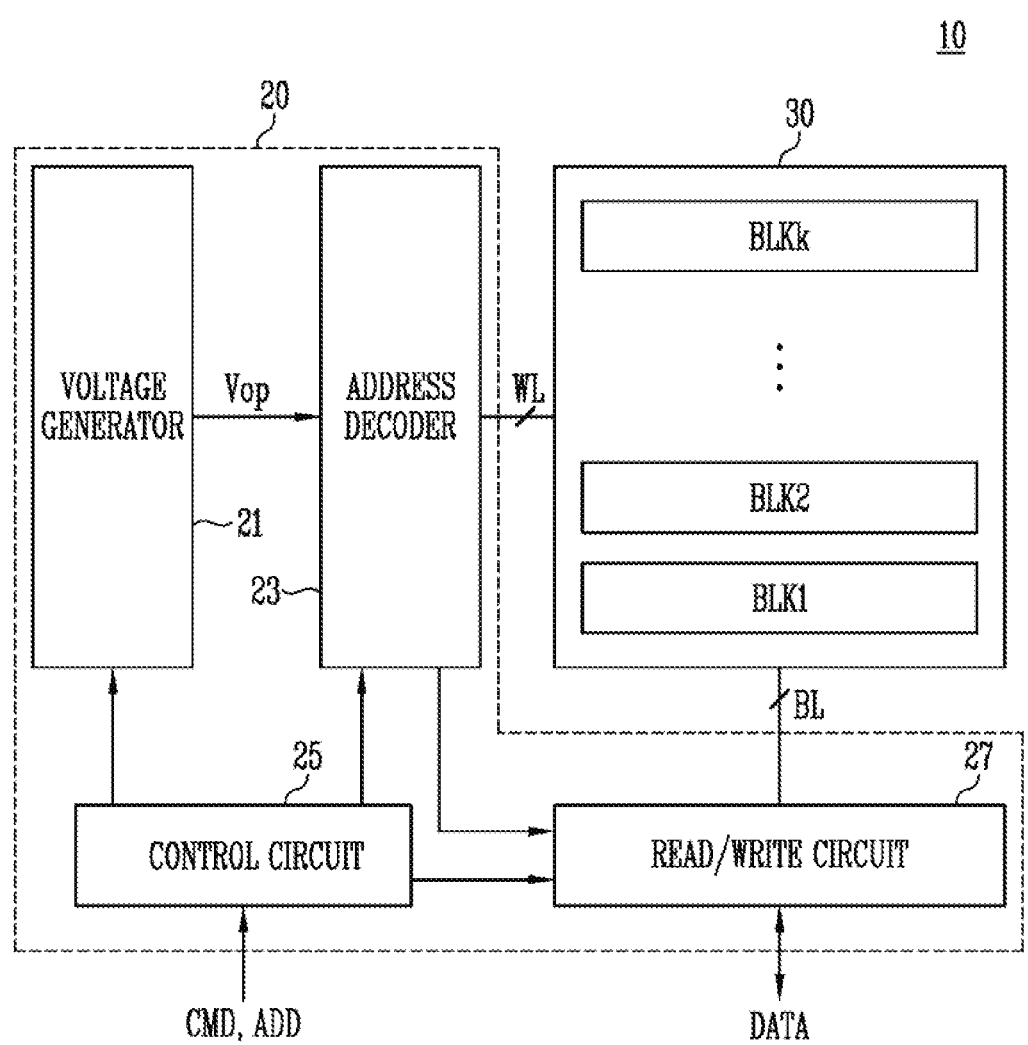
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a peripheral circuit 20 and a memory cell array 30.

The peripheral circuit 20 may include various circuits that control the memory cell array 30. In an embodiment, the peripheral circuit 20 may include a voltage generator 21, an address decoder 23, a control circuit 25 and a read/write circuit 27.

The memory cell array 30 may include a plurality of memory blocks BLK1 to BLKk (k is a natural number). The plurality of memory blocks BLK1 to BLKk may be connected to the address decoder 23 through word lines WL. The plurality of memory blocks BLK1 to BLKk may be connected to the read/write circuit 27 through bit lines BL. Each of the memory blocks BLK1 to BLKk includes a plurality of memory cells. The plurality of memory cells may be non-volatile memory cells. In an embodiment, the plurality of memory cells may be arranged in a three dimension.

The voltage generator 21 may supply various operation voltages Vop to the address decoder 23. The operation voltages Vop may be controlled to various levels according to a command CMD input to the control circuit 25. The operation voltages Vop may include a read voltage, a pass voltage, a verify voltage, a program voltage, an erase voltage, and the like.

The address decoder 23 may be configured to operate in response to the command CMD input to the control circuit 25. The address decoder 23 may be configured to decode a block address, a row address, and a column address in response to an address signal ADD input to the control circuit 25. The address decoder 23 may apply the operation voltages Vop generated by the voltage generator 21 to the word lines WL. The address decoder 23 may transmit the decoded column address to the read/write circuit 27.

The control circuit 25 may control the voltage generator 21 to generate the operation voltages Vop required for an operation of the memory cell array 30, in response to the command CMD input from the outside (for example, a memory controller). The control circuit 25 may control the read/write circuit 27 according to a type of the operation of the memory cell array 30.

The read/write circuit 27 may be configured to sense a threshold voltage of memory cells during a read operation and a program verify operation. The read/write circuit 27 may output data DATA read from the memory cells to an external device (for example, the memory controller) during the read operation. The read/write circuit 27 may control the bit lines BL according to control of the control circuit 25 and the address decoder 23 so that the data DATA received from the external device (for example, the memory controller) is written to the memory cell array 30, during the program operation.

The above-described peripheral circuit 20 may include a plurality of transistors, a plurality of resistors, and a plurality of capacitors. In an embodiment, the voltage generator 21 may include a regulator for voltage division, and the regulator may include a resistor. The resistor may be formed of the resistive film.

Figure 2:
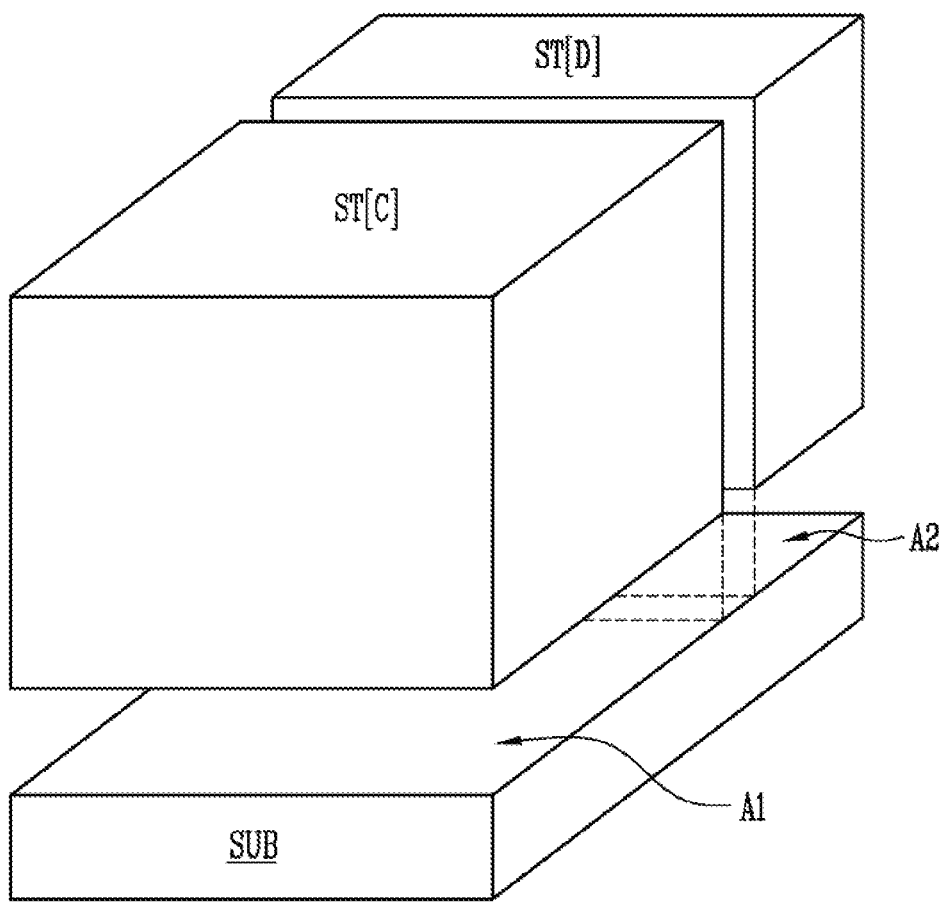
FIG. 2 is a perspective view schematically illustrating a semiconductor memory device according to an embodiment of the present disclosure.

FIG. 2 is a perspective view schematically illustrating a semiconductor memory device according to an embodiment of the present disclosure.

Referring to FIG. 2, the semiconductor memory device may include a substrate SUB, a cell stack ST[C], and a dummy stack ST[D].

The cell stacks ST[C] and the dummy stacks ST[D] may be spaced apart from each other in a plane parallel to the substrate SUB. The cell stack ST[C] and the dummy stack ST[D] may be disposed at substantially the same level. Each of the cell stack ST[C] and the dummy stack ST[D] may be spaced apart from the substrate SUB.

The substrate SUB may be a single crystal semiconductor film. For example, the substrate SUB may be a bulk silicon substrate, a silicon-on-insulator substrate, a germanium substrate, a germanium-on-insulator substrate, a silicon-germanium substrate, or an epitaxial film formed through a selective epitaxial growth method.

The substrate SUB may include a first area A1 overlapping the cell stack ST[C] and a second area A2 overlapping the dummy stack ST[D]. The substrate SUB may include the peripheral circuit 20 shown in FIG. 1. In an embodiment, a plurality of transistors may be formed in the first area A1 and the second area A2 of the substrate SUB.

Figure 3A:
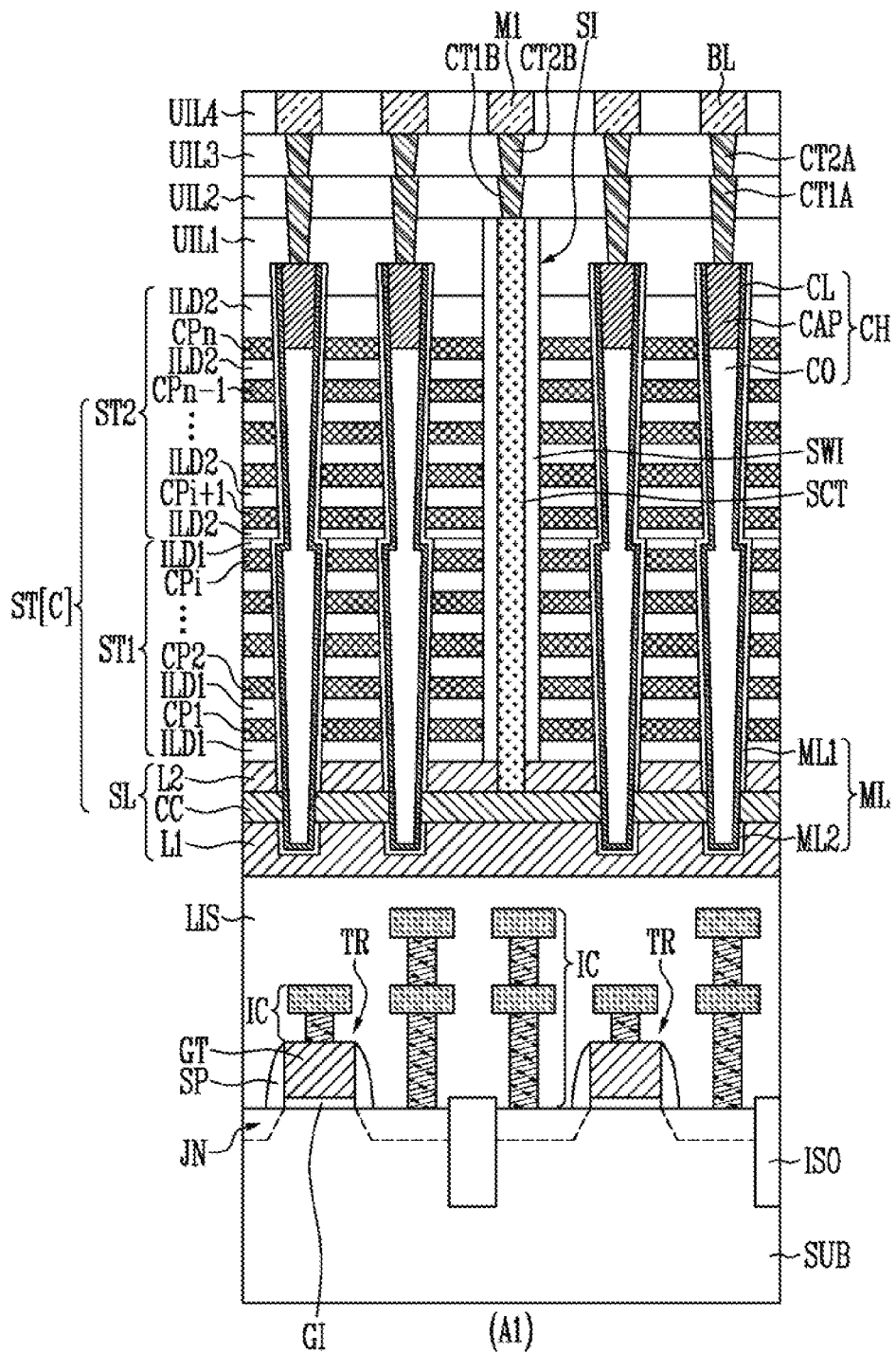
FIGS. 3A and 3B are cross-sectional views illustrating the semiconductor memory device according to an embodiment of the present disclosure.
Figure 3B:
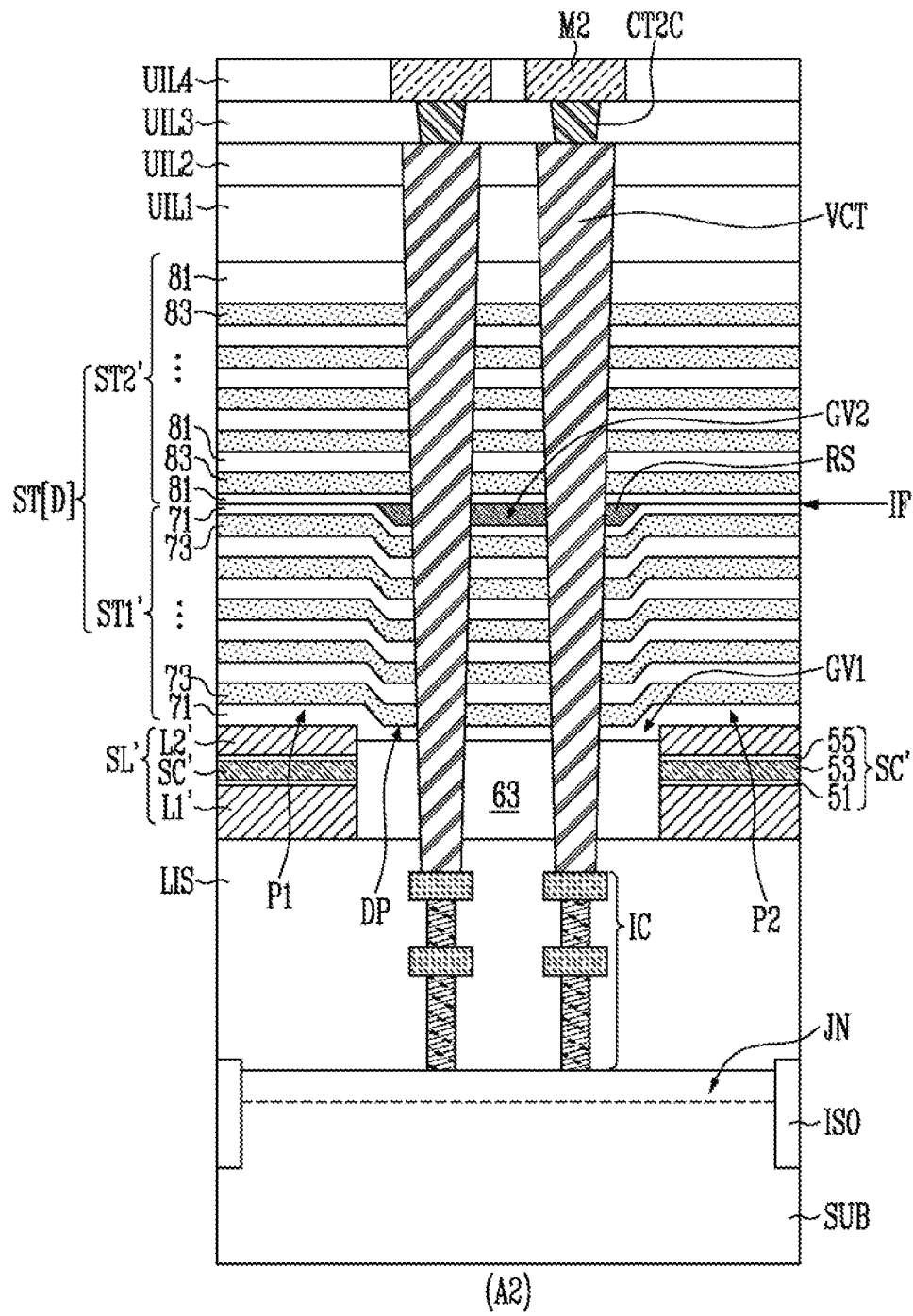

FIGS. 3A and 3B are cross-sectional views illustrating the semiconductor memory device according to an embodiment of the present disclosure. FIG. 3A is a cross-sectional view illustrating an embodiment of the cell stack ST[C] overlapping the first area A1 of the substrate SUB. FIG. 3B is a cross-sectional view illustrating an embodiment of the dummy stack ST[D] overlapping the second area A2 of the substrate SUB.

Referring to FIGS. 3A and 3B, the first area A1 and the second area A2 of the substrate SUB may include a plurality of active regions partitioned by isolation layers ISO. Transistors TR may be disposed in the first area A1 and the second area A2. Each of the transistors TR may include a gate insulating film GI and a gate electrode GT stacked on the active region, and junctions JN disposed in the active region on both sides of the gate electrode GT. The junctions JN may be defined by injecting at least one of n-type and p-type impurities into the active regions on both sides of the gate electrode GT. The junctions JN of each of the transistors TR may be used as a source region and a drain region. A sidewall of the gate electrode GT may be covered with a spacer insulating film SP.

The junctions JN and the gate electrodes GT may be connected to interconnection structures IC. Each of the interconnection structures IC may include at least one of a contact plug, a pad pattern, and a conductive line, the contact plug, the pad pattern, and the conductive line formed of a conductive material.

The substrate SUB may be covered with a lower insulating structure LIS. The transistors TR and the interconnection structures IC may be embedded inside the lower insulating structure LIS. The lower insulating structure LIS may include a plurality of insulating films stacked on the substrate SUB.

Referring to FIG. 3A, the cell stack ST[C] may include a source structure SL, a first cell stack ST1, and a second cell stack ST2 stacked on the lower insulating structure LIS.

The source structure SL may include a first source film L1 disposed on the lower insulating structure LIS and a channel-contact film CC disposed on the first source film L1. The source structure SL may further include a second source film L2 disposed on the channel-contact film CC. Each of the first source film L1, the channel-contact film CC, and the second source film L2 may be a doped semiconductor film including a at least one of an n-type impurity and a p-type impurity. In an embodiment, each of the first source film L1, the channel-contact film CC, and the second source film L2 may include a doped silicon film including an n-type impurity.

The first cell stack ST1 may include first cell interlayer insulating films ILD1 and first conductive patterns CP1 to CPi (i is a natural number equal to or greater than 2) alternately stacked on the source structure SL. The second cell stack ST2 may include second cell interlayer insulating films ILD2 and second conductive patterns CPi+1 to CPn (n is a natural number greater than i) alternately stacked on the first cell stack ST1.

Each of the first conductive patterns CP1 to CPi and the second conductive patterns CPi+1 to CPn may include various conductive materials such as a doped silicon film, a metal film, and a metal silicide film, and may include two or more types of conductive materials. A barrier film (not shown) may be further formed along surfaces of each of the first conductive patterns CP1 to CPi and the second conductive patterns CPi+1 to CPn. In an embodiment, each of the first conductive patterns CP1 to CPi and the second conductive patterns CPi+1 to CPn may include tungsten, and a titanium nitride film may be formed as the barrier film along a surface of tungsten.

The first cell stack ST1 and the second cell stack ST2 may be penetrated by channel structures CH. The channel structures CH may extend into the first source film L1. That is, the first source film L1 may surround lower ends of each of the channel structures CH.

Each of the channel structures CH may be surrounded by a memory film ML. The memory film ML may extend along a sidewall of the channel structure CH corresponding to the memory film ML.

Each of the channel structures CH may include sidewalls contacting the source structure SL. In an embodiment, each of the channel structures CH may include sidewalls contacting the channel-contact film CC passing through the memory film ML. The memory film ML may be divided into a first memory pattern ML1 and a second memory pattern ML2 by the channel-contact film CC. The first memory pattern ML1 extends between the channel structure CH corresponding to the first memory pattern ML1 and the second source film L2. The first memory pattern ML1 extends between the channel structure CH corresponding to the first memory pattern ML1 and the first cell stack ST1. The first memory pattern ML1 extends between the channel structure CH corresponding to the first memory pattern ML1 and the second cell stack ST2. The second memory pattern ML2 extends between the channel structure CH corresponding to the second memory pattern ML2 and the first source film L1.

Each of the channel structures CH may include a channel film CL. The channel film CL may include a semiconductor material. In an embodiment, the channel film CL may include silicon. A center area of the channel film CL may be filled with a core insulating film CO and a capping pattern CAP. The core insulating film CO may be formed at a height lower than that of the channel film CL. The capping pattern CAP may be disposed on the core insulating film CO. The capping pattern CAP may include a doped semiconductor film. In an embodiment, the capping pattern CAP may include n-type doped silicon. The channel-contact film CC may contact a sidewall of the channel film CL.

The channel film CL may be used as a channel region of a cell string. The first conductive patterns CP1 to CPi and the second conductive patterns CPi+1 to CPn may include source select lines, word lines, and drain select lines. In an embodiment, the first conductive pattern CP1 of the lowest layer adjacent to the source structure SL may be used as the source select line, the second conductive pattern CPn of the highest layer may be used as the drain select line, and the remaining first conductive patterns CP2 to CPi and the remaining second conductive patterns CPi+1 to CPn−1 may be used as the word lines. A source select transistor may be defined at an intersection of the channel structure CH and the first conductive pattern (for example, CP1) used as the source select line, a drain select transistor may be defined at an intersection of the channel structure CH and the second conductive pattern (for example, CPn) used as the drain select line, and the memory cells may be defined at intersections of the channel structure CH and the first conductive patterns (for example, CP2 to CPi) and the second conductive patterns (for example, CPi+1 to CPn−1) used as the word lines. The drain select transistor, the source select transistor, and the memory cells connected in series by the channel film CL may form the cell string of the memory block.

The cell stack ST[C] and the channel structures CH may be covered with a first upper insulating film UIL1. A slit SI may pass through the first upper insulating film UIL1. The slit SI may extend to pass through the first cell stack ST1 and the second cell stack ST2. A sidewall of the first cell stack ST1 and a sidewall of the second cell stack ST2 defined along the slit SI may be covered with a sidewall insulating film SWI.

A center area of the slit SI may be filled with a source contact structure SCT. The source contact structure SCT may be disposed on the sidewall insulating film SWI and may extend to pass through the second source film L2. The source contact structure SCT may contact the channel-contact film CC. The source contact structure SCT may be formed of various conductive materials.

Upper insulating films UIL2 to UIL4 of multiple layers may be stacked on the first upper insulating film UIL1. In an embodiment, a second upper insulating film UIL2, a third upper insulating film UIL3, and a fourth upper insulating film UIL4 may be sequentially stacked on the first upper insulating film UIL1.

The second upper insulating film UIL2 may be penetrated by a first drain contact plug CT1A and a first source contact plug CT1B. The first drain contact plug CT1A may pass through the first upper insulating film UIL1 and may contact the capping pattern CAP of the channel structure CH corresponding to the first drain contact plug CT1A. The first source contact plug CT1B may contact the source contact structure SCT. The first drain contact plug CT1A and the first source contact plug CT1B may include various conductive materials.

The third upper insulating film UIL3 may be penetrated by a second drain contact plug CT2A and a second source contact plug CT2B. The second drain contact plug CT2A may contact the first drain contact plug CT1A. The second source contact plug CT2B may contact the first source contact plug CT1B. The second drain contact plug CT2A and the second source contact plug CT2B may include various conductive materials.

The fourth upper insulating film UIL4 may be penetrated by a bit line BL and a first metal pattern M1. The bit line BL may contact the second drain contact plug CT2A. The bit line BL may be electrically connected to the channel structure CH corresponding to the bit line BL through the first drain contact plug CT1A and the second drain contact plug CT2A. The first metal pattern M1 may be electrically connected to the source structure SL through the source contact structure SCT, the first source contact plug CT1B, and the second source contact plug CT2B. The bit line BL and the first metal pattern M1 may include the same conductive material.

According to the above-described structure, a three-dimensional cell string including the memory cells, which are stacked along the channel film CL contacting the source structure SL and extending toward the bit line BL, may be formed.

Referring to FIG. 3B, the dummy stack ST[D] may include a dummy source structure SL', a first dummy stack ST1, and a second dummy stack ST2' stacked on the lower insulating structure LIS.

The dummy source structure SL' may be spaced apart from the source structure SL shown in FIG. 3A, and may be disposed at substantially the same level as the source structure SL. The dummy source structure SL' may include a first dummy source film L1' disposed on the lower insulating structure LIS and a sacrificial structure SC' disposed on the first dummy source film L1'. The dummy source structure SL' may further include a second dummy source film L2' disposed on the sacrificial structure SC'.

The first dummy source film L1' may be disposed at substantially the same level as the first source film L1 shown in FIG. 3A. The first dummy source film L1' may include the same material as the first source film L1 shown in FIG. 3A. In an embodiment, the first dummy source film L1' may include a doped silicon film including an n-type impurity.

The sacrificial structure SC' may include a first protective film 51, a sacrificial film 53, and a second protective film 55 stacked on the first dummy source film L1'. The first protective film 51 and the second protective film 55 may include a material having an etch selectivity to the sacrificial film 53. In an embodiment, the first protective film 51 and the second protective film 55 may include an oxide film, and the sacrificial film 53 may include silicon. The sacrificial structure SC' may be disposed at substantially the same level as the channel-contact film CC shown in FIG. 3A.

The second dummy source film L2' may be disposed on substantially the same level as the second source film L2 shown in FIG. 3A. The second dummy source film L2' may include the same material as the second source film L2 shown in FIG. 3A. In an embodiment, the second dummy source film L2' may include a doped silicon film including an n-type impurity.

The dummy source structure SL' may be penetrated by an insulating film 63. The insulating film 63 may be formed lower than the dummy source structure SL'. For example, a height of the insulating film 63 may be formed lower than a height of the dummy source structure SL' as illustrated in FIG. 3B. A first groove GV1 may be defined by the dummy source structures SL' and the insulating film 63 of which heights are different from each other.

The first dummy stack ST1' may be spaced apart from the first cell stack ST1 shown in FIG. 3A. The first dummy stack ST1' may include first material films 71 and second material films 73 alternately stacked. The first dummy stack ST1' may include a depression DP and protrusions P1 and P2 disposed on both sides of the depression DP. Each of the protrusions P1 and P2 may include horizontal portions of the first material films 71 and horizontal portions of the second material films 73 overlapping the dummy source structure SL'. Each of the protrusions P1 and P2 may be disposed at substantially the same level as the first cell stack ST1 shown in FIG. 3A. The depression DP may include bending portions of the first material films 71 and bending portions of the second material films 73 overlapping the insulating film 63. The bending portions of the first material films 71 may extend from the horizontal portions of the first material films 71 and the bending portions of the second material films 73 may extend from the horizontal portions of the second material films 73. Each of the bending portions of the first material films 71 and the bending portions of the second material films 73 may be formed in a U shape. A second groove GV2 may be defined on an upper surface of the first dummy stack ST1' by the depression DP of the first dummy stack ST1'.

The resistive film RS may overlap the depression DP. The resistive film RS may be formed to fill the second groove GV2. Accordingly, a roughness of the upper surface of the first dummy stack ST1' due to the depression DP may be alleviated by the resistive film RS. In an embodiment, an upper surface of the resistive film RS may be aligned at a level substantially the same as an upper surface of the protrusions P1 and P2. The resistive film RS may include a conductive material having an etch selectivity to the first material films 71 and the second material films 73. In an embodiment, the resistive film RS may include metal. In an embodiment, the metal may include tungsten. In an embodiment, the metal may include tungsten, and may further include at least one of titanium and titanium nitride films.

The second dummy stack ST2' may include third material films 81 and fourth material films 83 alternately stacked on the first dummy stack ST1'. The second dummy stack ST2' may extend to cover the first dummy stack ST1' and the resistive film RS. Accordingly, the resistive film RS may be embedded inside the dummy stack ST[D]. The second dummy stack ST2' may be spaced apart from the second cell stack ST2 shown in FIG. 3A and may be disposed at substantially the same level as the second cell stack ST2.

The first material films 71 and the third material films 81 may include the same material as the first cell interlayer insulating films ILD1 and the second cell interlayer insulating films ILD2 shown in FIG. 3A. In an embodiment, each of the first material films 71, the third material films 81, the first cell interlayer insulating films ILD1, and the second cell interlayer insulating films ILD2 may include silicon oxide.

The second material films 73 and the fourth material films 83 may include an insulating material having an etch selectivity to the first material films 71 and the third material films 81. In an embodiment, each of the second material films 73 and the fourth material films 83 may include silicon nitride.

The first upper insulating film UIL1, the second upper insulating film UIL2, the third upper insulating film UIL3, and the fourth upper insulating film UIL4 may extend to overlap the dummy stack ST[D].

The resistive film RS may be electrically connected to some of the elements configuring the peripheral circuit by a contact plug VCT passing through the dummy stack ST[D]. In an embodiment, the resistive film RS may be electrically connected to the junction JN of the transistor formed in the second area A2. To this end, the contact plug VCT may pass through the dummy stack ST[D], the resistive film RS, and the insulating film 63, and may contact the interconnection structure IC connected to the junction JN. The resistive film RS may be electrically connected to the transistor through the interconnection structure IC and the contact plug VCT.

The contact plug VCT may extend to pass through at least one of the first upper insulating film UIL1, the second upper insulating film UIL2, the third upper insulating film UIL3, and the fourth upper insulating film UIL4. In an embodiment, the contact plug VCT may extend to pass through the first upper insulating film UIL1 and the second upper insulating film UIL2. The contact plug VCT may be electrically connected to a second metal pattern M2. In an embodiment, the contact plug VCT may be connected to the second metal pattern M2 passing through the fourth upper insulating film UIL4 via an upper contact plug CT2C passing through the third upper insulating film UIL3. The contact plug VCT and the upper contact plug CT2C may include various conductive materials.

Figure 4:
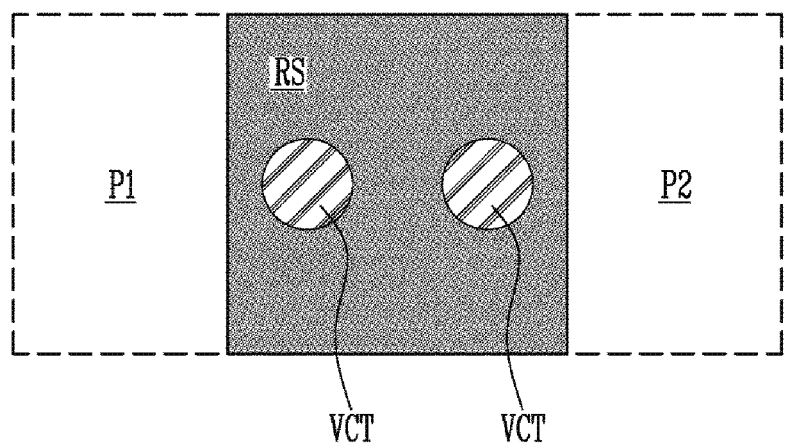
FIG. 4 is a plan view illustrating a resistive film shown in FIG. 3B.

FIG. 4 is a plan view illustrating the resistive film RS shown in FIG. 3B. FIG. 4 illustrates a structure of the resistive film RS in a plane cut along an interface IF of the first dummy stack ST1' and the second dummy stack ST2' shown in FIG. 3B.

Referring to FIG. 4, the resistive film RS may be disposed between the protrusions P1 and P2 of the first dummy stack and may be expanded along a plane parallel to the interface IF shown in FIG. 3B. A portion of the resistive film RS may be penetrated by the contact plug VCT.

Figure 5:
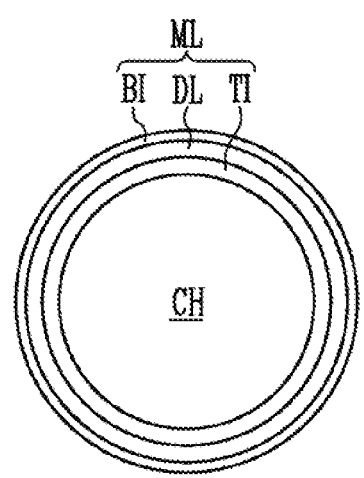
FIG. 5 is a cross-sectional view illustrating a channel structure and a memory film shown in FIG. 3A.

FIG. 5 is a cross-sectional view illustrating the channel structure CH and the memory film ML shown in FIG. 3A.

Referring to FIG. 5, the memory film ML surrounding the channel structure CH may include a tunnel insulating film TI surrounding the channel structure CH, a data storage film DL surrounding the tunnel insulating film TI, and a blocking insulating film BI surrounding the data storage film DL. The data storage film DL may be formed of a material film that may store changed data using Fowler-Nordheim tunneling. To this end, the data storage film DL may be formed of various materials. In an embodiment, the data storage film DL may be formed of a nitride film capable of charge trapping. An embodiment of the present disclosure is not limited thereto, and the data storage film DL may include silicon, a phase change material, a nano-dot, and the like.

The blocking insulating film BI may include an oxide film capable of charge blocking. The tunnel insulating film TI may be formed of a silicon oxide film capable of charge tunneling.

FIGS. 6A, 6B, 6C, 6D, 6E, 6F, 6G, 6H, 6I, 6J, 6K, 6L, 6M, and 6N are cross-sectional views illustrating a method of manufacturing a semiconductor memory device according to an embodiment of the present disclosure.

Figure 6A:
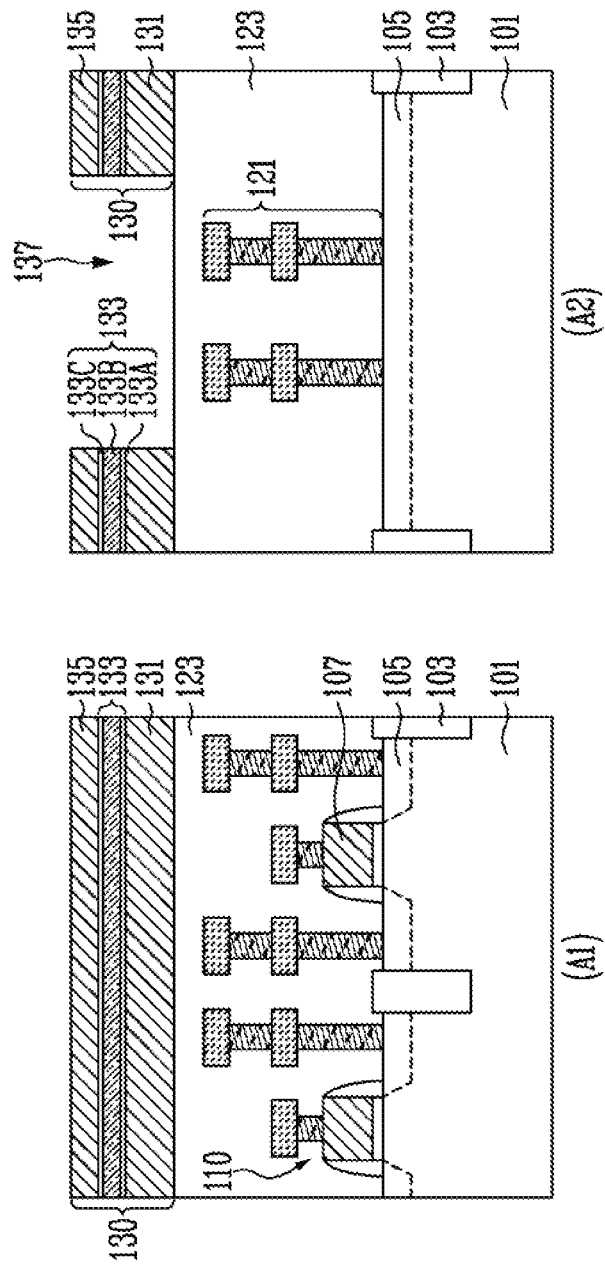

Referring to FIG. 6A, elements of the peripheral circuit including transistors 110 may be formed on a substrate 101 including the first area A1 and the second area A2. The transistors 110 may include junctions 105. The junctions 105 may be formed in the active regions of the substrate 101 partitioned by isolation layers 103. The junctions 105 may be formed in each of the first area A1 and the second area A2. The transistors 110 may include gate electrodes 107 disposed on the active regions. The junctions 105 may be defined by injecting at least one of n-type and p-type impurities into the active regions exposed on both sides of the gate electrodes 107.

After forming the elements configuring the peripheral circuit, interconnection structures 121 connected to the peripheral circuit may be formed. The interconnection structures 121 may be connected to the transistors 110.

The interconnection structures 121 and the transistors 110 may be embedded inside a lower insulating structure 123 covering the substrate 101. The lower insulating structure 123 may include insulating films of multiple layers.

Subsequently, a preliminary source structure 130 may be formed on the lower insulating structure 123. The preliminary source structure 130 may include a first source film 131 and a sacrificial structure 133 sequentially stacked. The preliminary source structure 130 may further include a second source film 135 stacked on the sacrificial structure 133. The sacrificial structure 133 may include a first protective film 133A, a sacrificial film 133B, and a second protective film 133C, which are stacked on the first source film 131.

The first source film 131 may include a doped semiconductor film including at least one of an n-type impurity and a p-type impurity. In an embodiment, the first source film 131 may include n-type doped silicon.

The first protective film 133A and the second protective film 133C may include a material having an etch selectivity to the sacrificial film 133B. In an embodiment, the sacrificial film 133B may include undoped silicon, and each of the first protective film 133A and the second protective film 133C may include an oxide film.

The second source film 135 may include a doped semiconductor film or an undoped semiconductor film. In an embodiment, the second source film 135 may include n-type doped silicon or undoped silicon.

Subsequently, an opening 137 passing through a portion of the preliminary source structure 130 overlapping the second area A2 may be formed. As an embodiment, the opening 137 may expose the lower insulating structure 123.

Figure 6B:
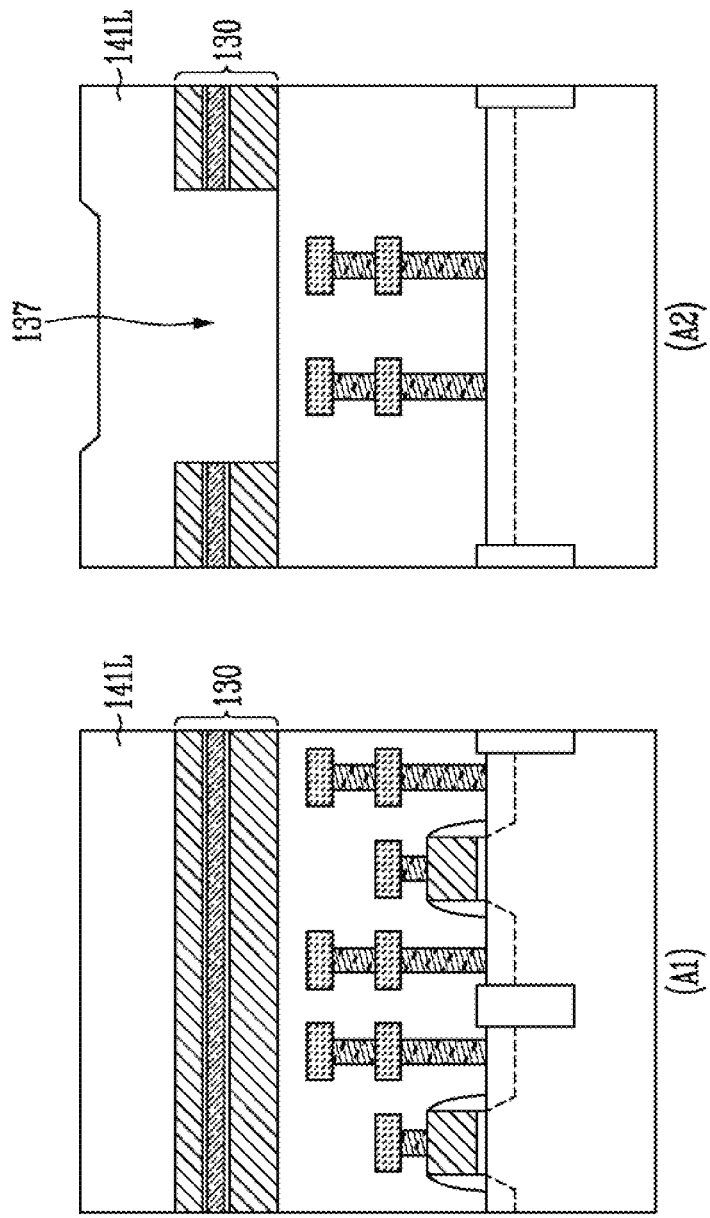

Referring to FIG. 6B, a preliminary insulating film 141L may be formed on the preliminary source structure 130 so that the opening 137 is filled.

Figure 6C:
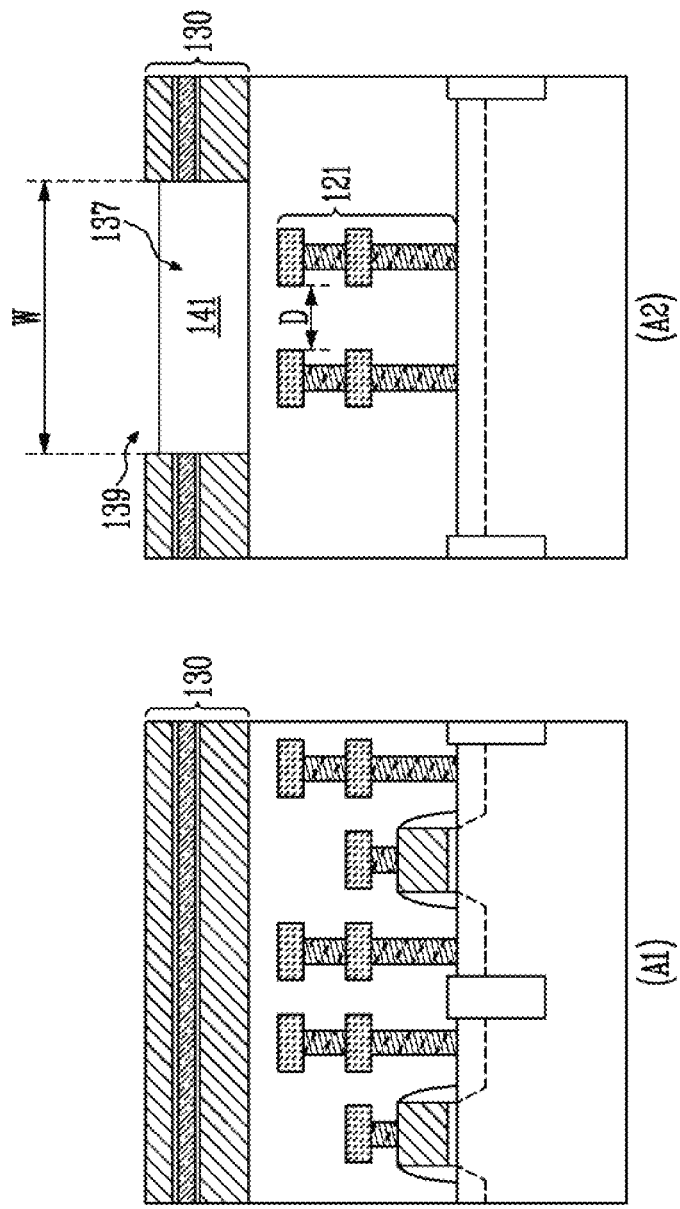

Referring to FIG. 6C, the preliminary insulating film 141L shown in FIG. 6B may be planarized so that an upper surface of the preliminary source structure 130 is exposed. Accordingly, an insulating film 141 lower than the preliminary source structure 130 may remain inside the opening 137. A planarization process may include a chemical mechanical polishing (CMP) process.

When a width W of the opening 137 is wide, while performing the planarization process, a dishing effect may occur. In an embodiment, the width W of the opening 137 may be wider than a distance D between the interconnection structures 121 disposed in the second area A2 and adjacent to each other. An embodiment of the present disclosure is not limited thereto, and the width W of the opening 137 may be variously changed according to design of the semiconductor memory device.

As the height of the insulating film 141 is controlled to be lower than that of the preliminary source structure 130, a first groove 139 may be defined by a height difference between the preliminary source structure 130 and the insulating film 141.

In an embodiment, when the dishing effect does not occur during the planarization process, a portion of the insulating film 141 may be additionally etched to form the first groove 139.

Referring to FIG. 6D, a first stack 150 extending to overlap the preliminary source structure 130 and the insulating film 141 may be formed. The first stack 150 may include first material films 151 and second material films 153 alternately stacked on the preliminary source structure 130 and the insulating film 141.

Each of the first material films 151 and the second material films 153 may have a substantially U-shaped bending portion overlapping the insulating film 141. Accordingly, the first stack 150 may have a depression 150DP overlapping the insulating film 141. A second groove 155 may be defined on an upper surface of the first stack 150 by the depression 150DP.

The first material films 151 and the second material films 153 may include insulating materials. The second material films 153 may include an insulating material having an etch selectivity to the first material films 151. In an embodiment, each of the first material films 151 may include silicon oxide, and each of the second material films 153 may include silicon nitride.

Figure 6E:
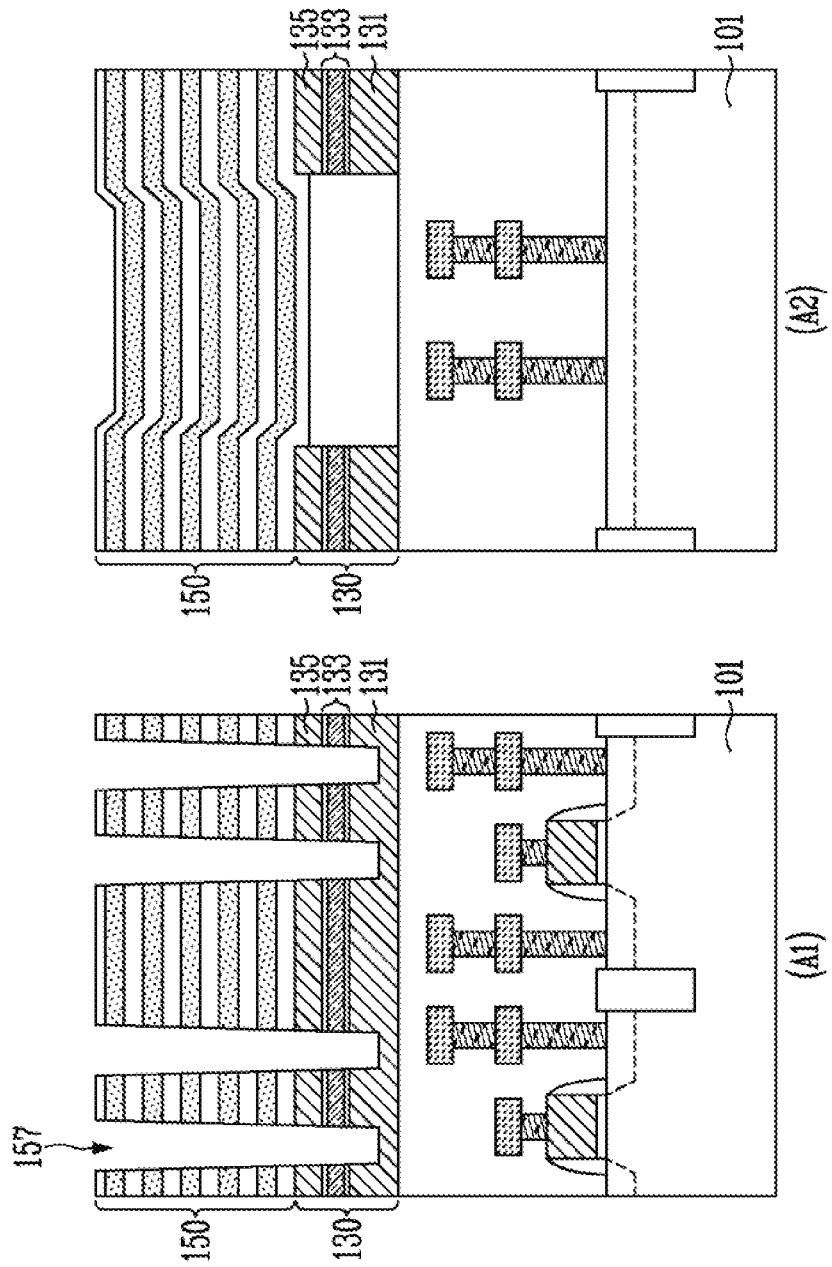

Referring to FIG. 6E, a lower hole 157 passing through the first stack 150 and extending into the preliminary source structure 130 may be formed. The lower hole 157 may overlap the first area A1 of the substrate 101. The lower hole 157 may pass through the second source film 135 and the sacrificial structure 133 of the preliminary source structure 130, and may extend into the first source film 131.

Figure 6F:
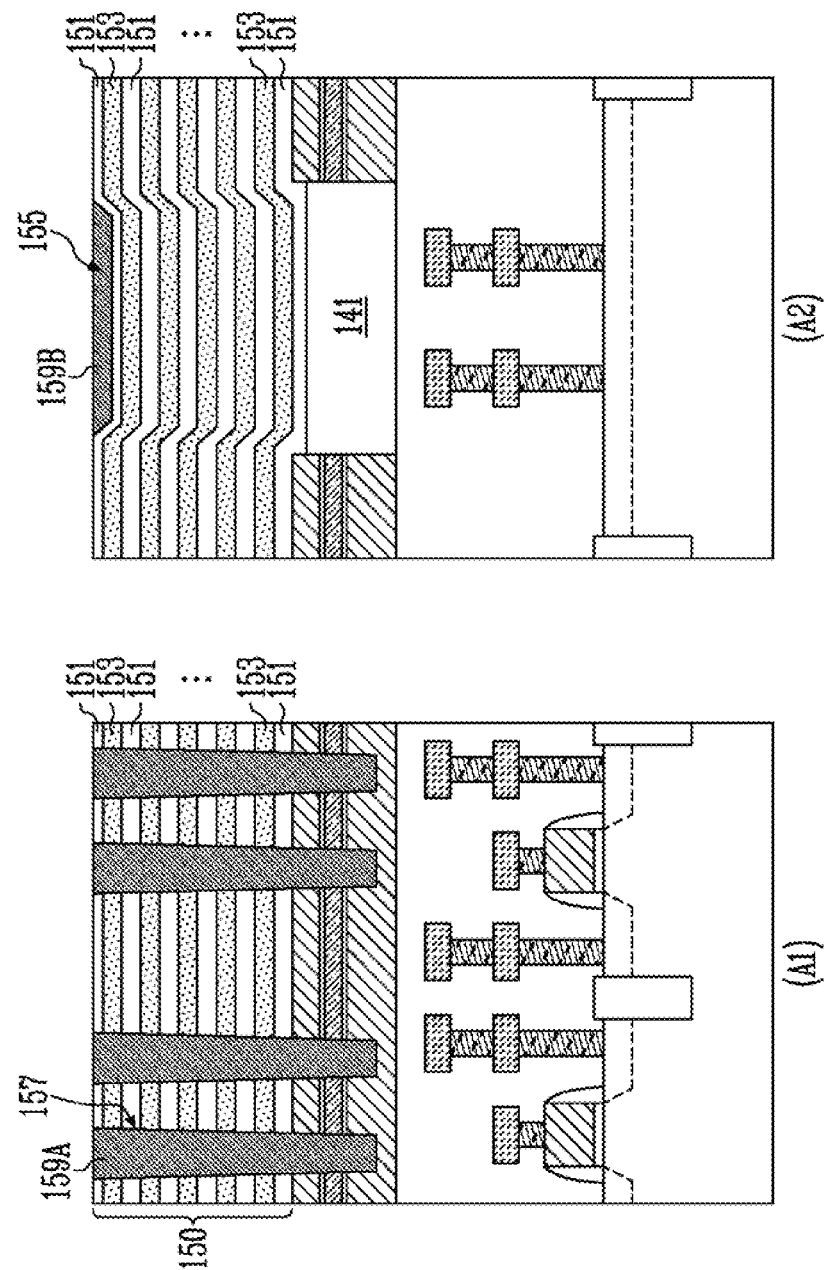

Referring to FIG. 6F, after forming a metal film filling the lower hole 157 and the second groove 155, the metal film may be planarized. In an embodiment, a planarization process of the metal film may be performed by a CMP method.

While planarizing the metal film, a portion of the metal film may be removed so that an upper surface of the first stack 150 is exposed. Therefore, the metal film may be separated into a sacrificial column 159A and a resistive film 159B. The sacrificial column 159A may remain to fill the lower hole 157, and the resistive film 159B may overlap the depression 150DP shown in FIG. 6D and remain to fill the second groove 155.

The metal film may include a conductive material having an etch selectivity to the first material films 151 and the second material films 153. In an embodiment, the metal film may include tungsten. In an embodiment, the metal film may include tungsten, and may further include at least one of titanium and titanium nitride films.

As described above, the manufacturing process may be simplified by forming the resistive film 159B using a process of forming the sacrificial column 159A.

Referring to FIG. 6G, a second stack 160 may be formed by alternately stacking third material films 161 and fourth material films 163 on the first stack 150. The second stack 160 may extend to cover the sacrificial column 159A and the resistive film 159B.

The third material films 161 may include the same insulating materials as the first material films 151, and the fourth material films 163 may include the same insulating materials as the second material films 153. In an embodiment, each of the third material films 161 may include silicon oxide, and each of the fourth material films 163 may include silicon nitride.

Figure 6H:
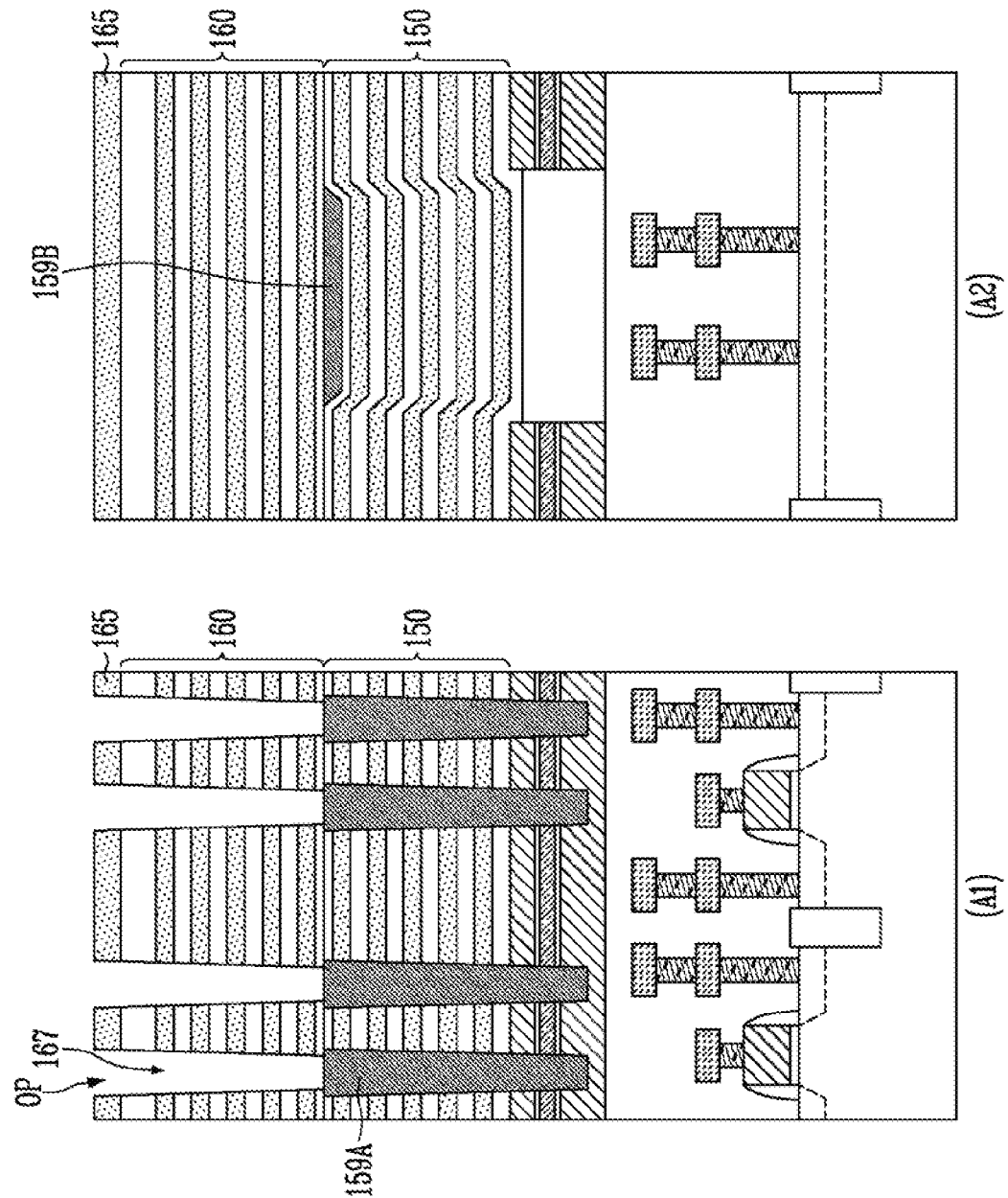
Figure 61:
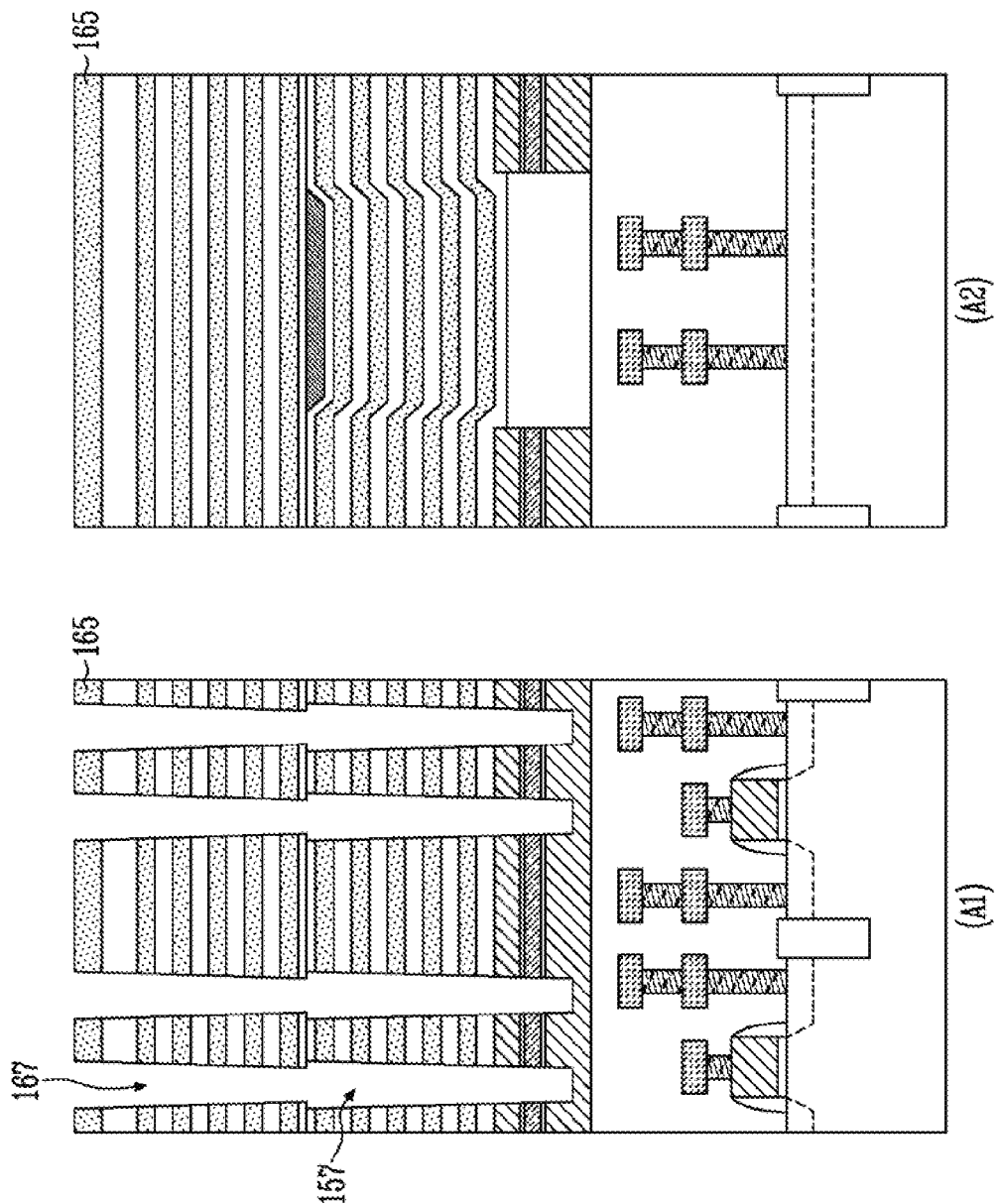

Referring to FIG. 6H, a mask pattern 165 may be formed on the second stack 160. The mask pattern 165 may include an opening OP overlapping the sacrificial column 159A.

An upper hole 167 passing through the second stack 160 may be formed by etching a portion of the second stack 160 exposed by the opening OP of the mask pattern 165. The upper hole 167 may be formed to expose the sacrificial column 159A.

Referring to FIG. 6I, the sacrificial column 159A shown in FIG. 6H may be removed through the upper hole 167. Accordingly, the lower hole 157 may be opened.

Figure 6J:
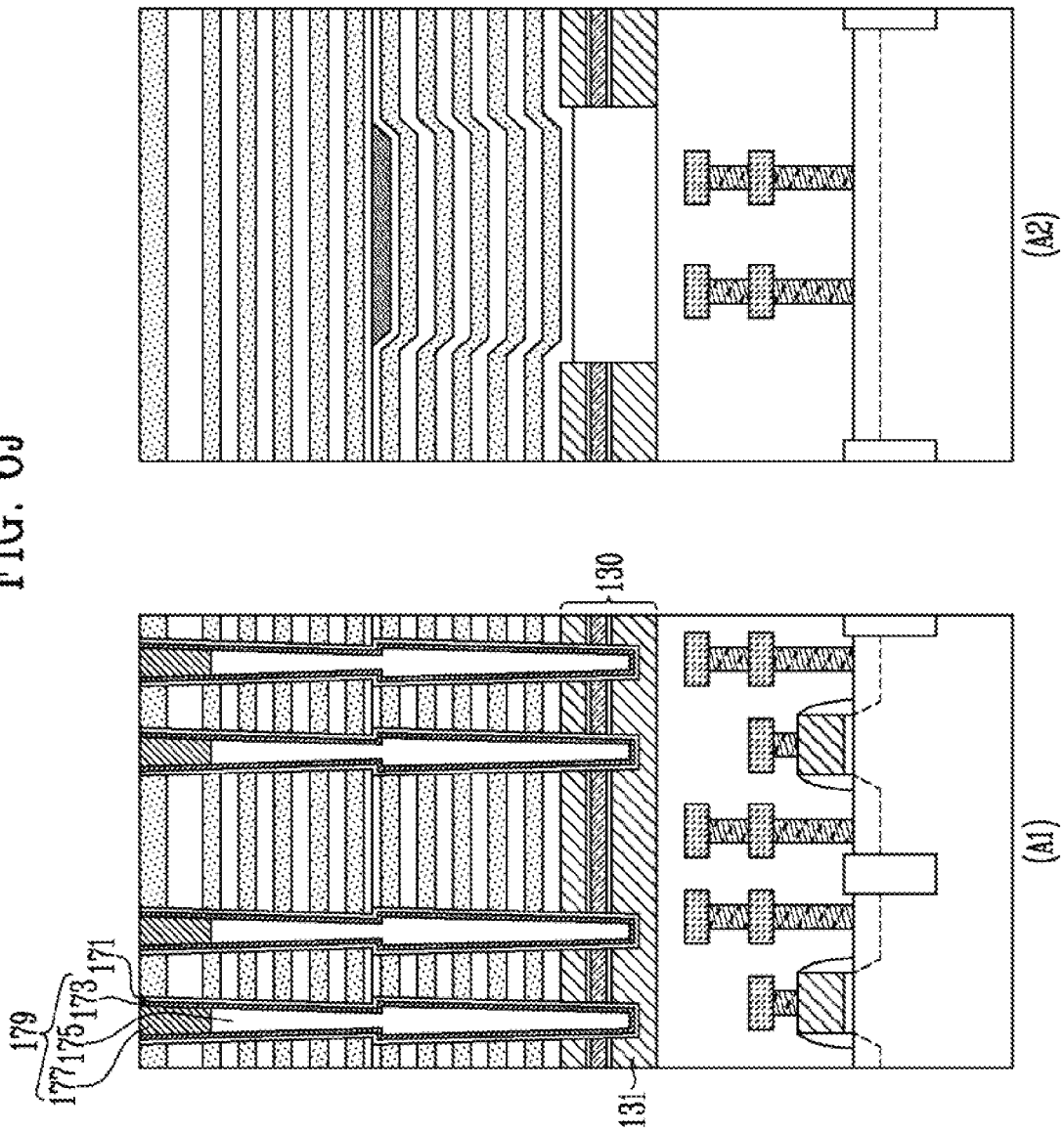

Referring to FIG. 6J, a memory film 171 extending along surfaces of the upper hole 167 and the lower hole 157 shown in FIG. 6I may be formed. The memory film 171 may include the tunnel insulating film TI, the data storage film DL, and the blocking insulating film BI shown in FIG. 5.

Subsequently, a channel structure 179 may be formed on the memory film 171. The channel structure 179 may extend to fill the upper hole 167 and the lower hole 157 shown in FIG. 6I. In an embodiment, forming the channel structure 179 may include forming a channel film 173 on the memory film 171, forming a core insulating film 175 on the channel film 173, removing a portion of the core insulating film 175, and filling an area where the core insulating film 175 is removed with a capping pattern 177. The channel film 173 may include a semiconductor film. In an embodiment, the channel film 173 may include silicon. The capping pattern 177 may include a doped semiconductor film. In an embodiment, the capping pattern 177 may include n-type doped silicon.

Each of the memory film 171 and the channel structure 179 may extend into the first source film 131 of the preliminary source structure 130 overlapping the first area A1.

Figure 6K:
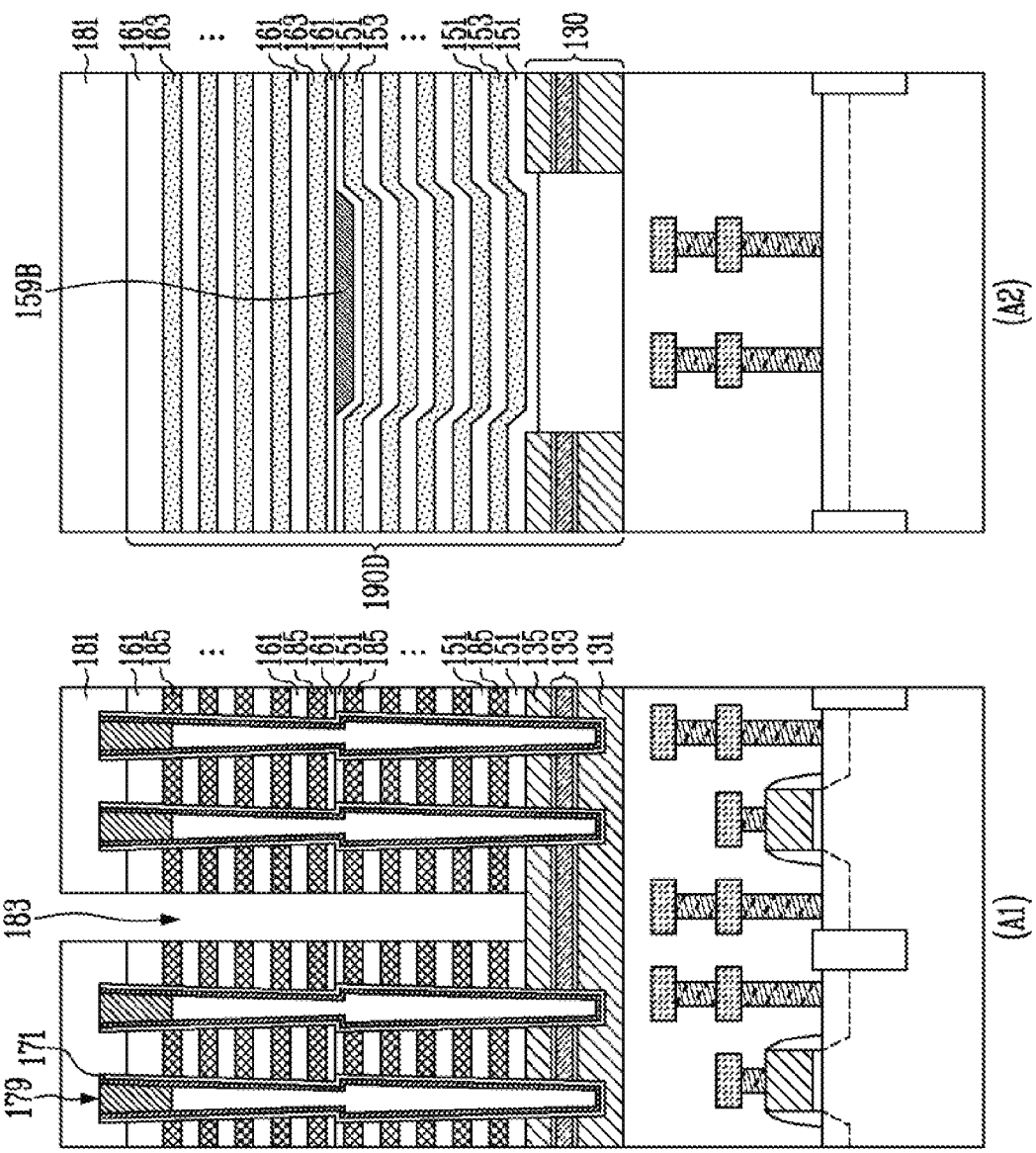

Referring to FIG. 6K, the mask pattern 165 shown in FIG. 6J may be removed. Subsequently, a first upper insulating film 181 may be formed to cover the channel structure 179.

Thereafter, at etching process may be performed so that the preliminary source film 130, the first material films 151, the second material films 153, the third material films 161, and the fourth material films 163 overlapping the second area A2 are patterned as a dummy stack 190D.

Subsequently, a slit 183 may be formed to pass through the first upper insulating film 181 overlapping the first area A1, and the first material films 151, the second material films 153, the third material films 161, and the fourth material films 163 overlapping the first area A1. The slit 183 may be formed to expose the second source film 135. Thereafter, portions of the second material films 153 overlapping the first area A1 and portions of the fourth material films 163 overlapping the first area A1 may be replaced with conductive patterns 185 through the slit 183.

Referring to FIG. 6L, after forming a sidewall insulating film 191 on a sidewall of the slit 183, a slit extension 193 extending from the slit 183 may be formed. The slit extension 193 may pass through the second source film 135 exposed through a bottom surface of the slit 183.

Thereafter, a portion of the sacrificial structure 133 overlapping the first area A1 shown in FIG. 6K may be replaced with a channel-contact film 195 through the slit extension 193. Therefore, a cell stack 190C may be defined.

The channel-contact film 195 may pass through the memory film 171 shown in FIG. 6K and contact the channel film 173 of the channel structure 179. The memory film 171 may be separated into a first memory pattern 171A and a second memory pattern 171B by the channel-contact film 195.

Figure 6M:
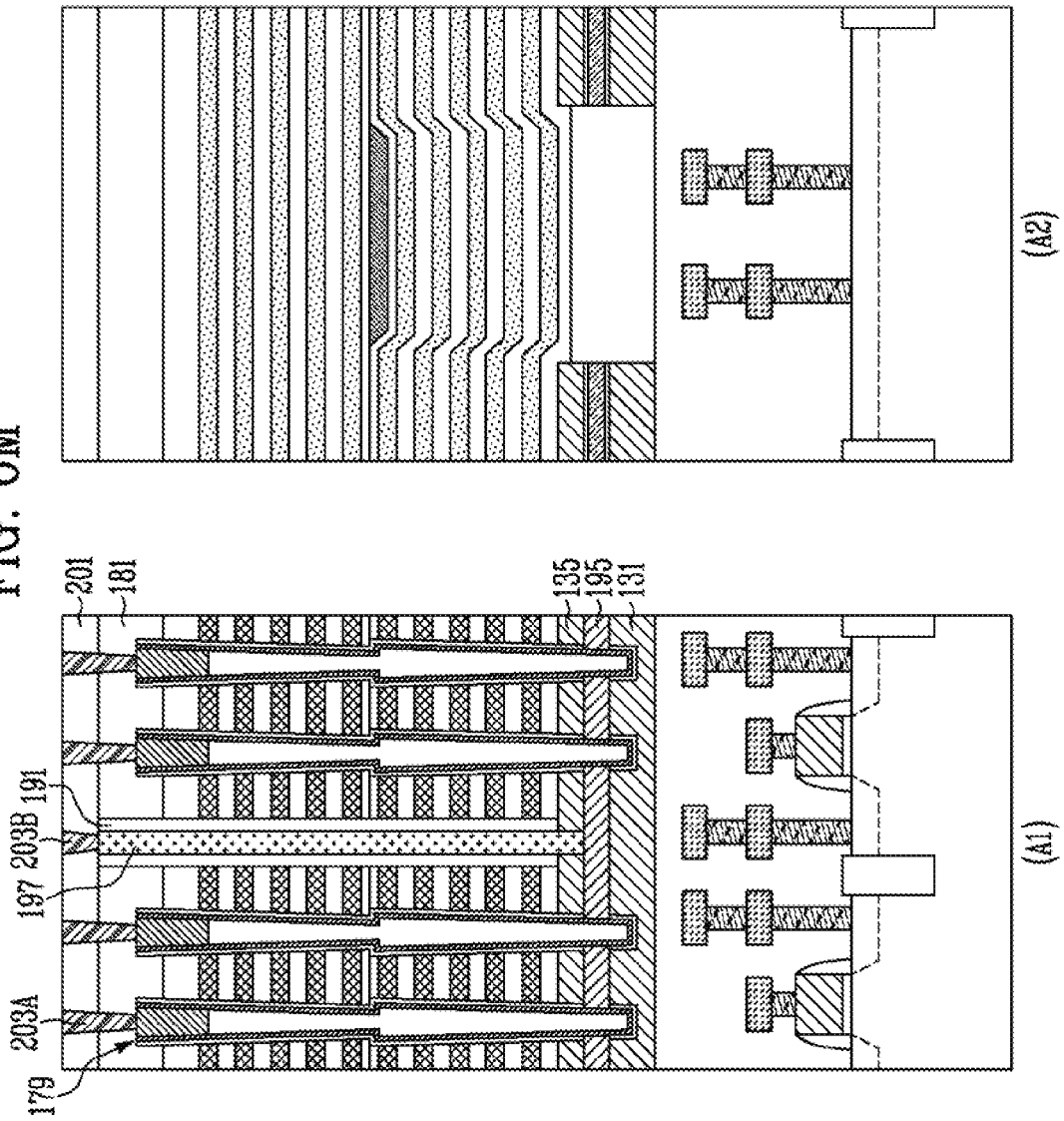

Referring to FIG. 6M, the slit 183 and the slit extension 193 shown in FIG. 6K may be filled with a source contact structure 197.

Thereafter, an upper insulating film 201 may be formed on the first upper insulating film 181 to cover the source contact structure 197.

Subsequently, a drain contact plug 203A and a source contact plug 203B may be formed to pass through at least one of the first upper insulating film 181 and the second upper insulating film 201. The drain contact plug 203A may pass through the first upper insulating film 181 and the second upper insulating film 201 and contact the channel structure 179. The source contact plug 203B may pass through the second upper insulating film 201 and contact the source contact structure 197.

Referring to FIG. 6N, a contact plug 211 may be formed to pass through the second upper insulating film 201 overlapping the second area A2. The contact plug 211 may extend to contact the interconnection structure 121 overlapping the second area A2. The interconnection structure 121 and the contact plug 211 may electrically connect the resistive film 159B to the element of the peripheral circuit. In an embodiment, the interconnection structure 121 and the contact plug 211 may connect the resistive film 159B to the junction 105 of the transistor disposed in the second area A2.

The contact plug 211 may pass through the insulating film 141, the first material films 151, the second material films 153, the resistive film 159B, the third material films 161, the fourth material films 163, the first upper insulating film 181, and the second upper insulating film 201. The contact plug 211 may pass through a portion of the lower insulating structure 123 to reach the interconnection structure 121.

Subsequently, subsequent processes for forming an upper contact plug and a metal line may be performed.

Figure 7:
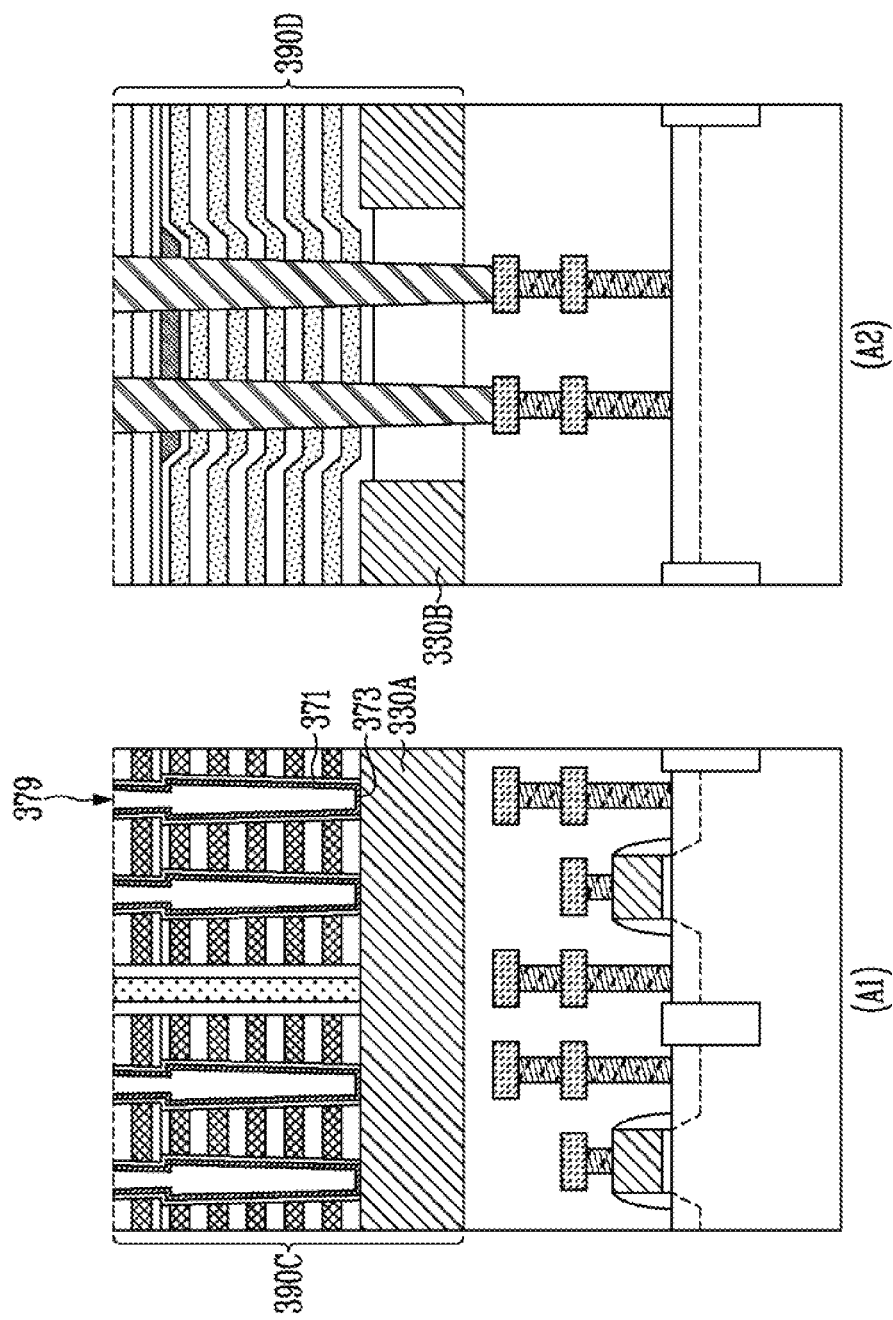
FIG. 7 is a cross-sectional view illustrating a semiconductor memory device and a method of manufacturing the same according to an embodiment of the present disclosure.

FIG. 7 is a cross-sectional view illustrating a semiconductor memory device and a method of manufacturing the same according to an embodiment of the present disclosure. Hereinafter, a detailed description of the repetitive configuration will be omitted, and a source film 330A of a cell stack 390C, a dummy source film 330B of a dummy stack 390D, a channel structure 379, and a memory film 371 will be described.

Referring to FIG. 7, the source film 330A and the dummy source film 330B may include the same material and may be formed in the same structure. In an embodiment, the source film 330A and the dummy source film 330B may include a doped semiconductor film. In an embodiment, the doped semiconductor film may include n-type doped silicon.

Forming the source film 330A and the dummy source film 330B described above may include forming the doped semiconductor film, and separating the doped semiconductor film into the source film 330A and the dummy source film 330B. Separating of the doped semiconductor film into the source film 330A and the dummy source film 330B may be performed by using a process for patterning the dummy stack described with reference to FIG. 6K.

The source film 330A may contact a bottom surface of the channel structure 379. The channel film 373 of the channel structure 379 may pass through the memory film 371 and contact an upper surface of the source film 330A.

Forming the channel film 373 described above may include etching a portion of the memory film 371 so that the doped semiconductor film is exposed after forming the memory film 371, and forming the channel film 373 on the memory film 371 so as to contact the exposed doped semiconductor film.

According to embodiments of the present disclosure, a resistive film overlaps the depression of the dummy stack. Therefore, the resistive film may overlap elements (for example, a transistor) of a peripheral circuit disposed on the substrate and embodiments of the present disclosure may reduce the area occupied by the peripheral circuit.

Figure 8:
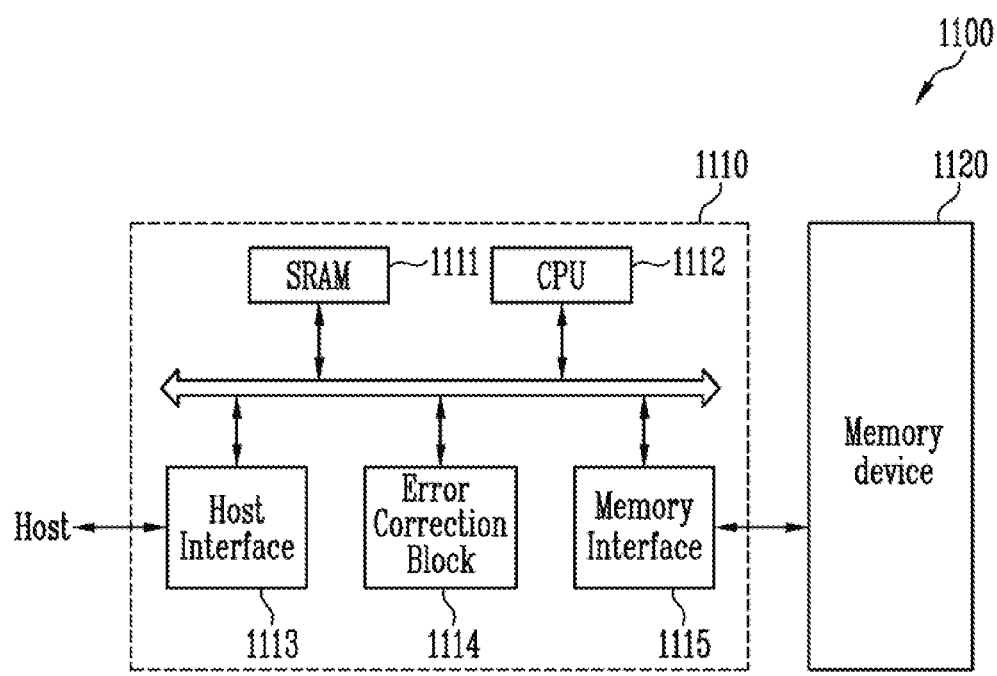
FIG. 8 is a block diagram illustrating a configuration of a memory system according to an embodiment of the present disclosure.

FIG. 8 is a block diagram illustrating a configuration of a memory system 1100 according to an embodiment of the present disclosure.

Referring to FIG. 8, the memory system 1100 includes a memory device 1120 and a memory controller 1110.

The memory device 1120 may include a resistive film overlapped the depression of the dummy stack. The memory device 1120 may be a multi-chip package configured of a plurality of flash memory chips.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs various control operations for exchanging data of the memory controller 1110, and the host interface 1113 includes a data exchange protocol of a host that is connected to the memory system 1100. In addition, the error correction block 1114 detects and corrects an error included in data read from the memory device 1120, and the memory interface 1115 performs an interfacing with the memory device 1120. In addition, the memory controller 1110 may further include a read only memory (ROM) or the like for storing code data for interfacing with the host.

The memory system 1100 described above may be a memory card or a solid state drive (SSD) in which the memory device 1120 and the controller 1110 are combined to each other. For example, when the memory system 1100 is an SSD, the memory controller 1110 may communicate with the outside (for example, the host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 9:
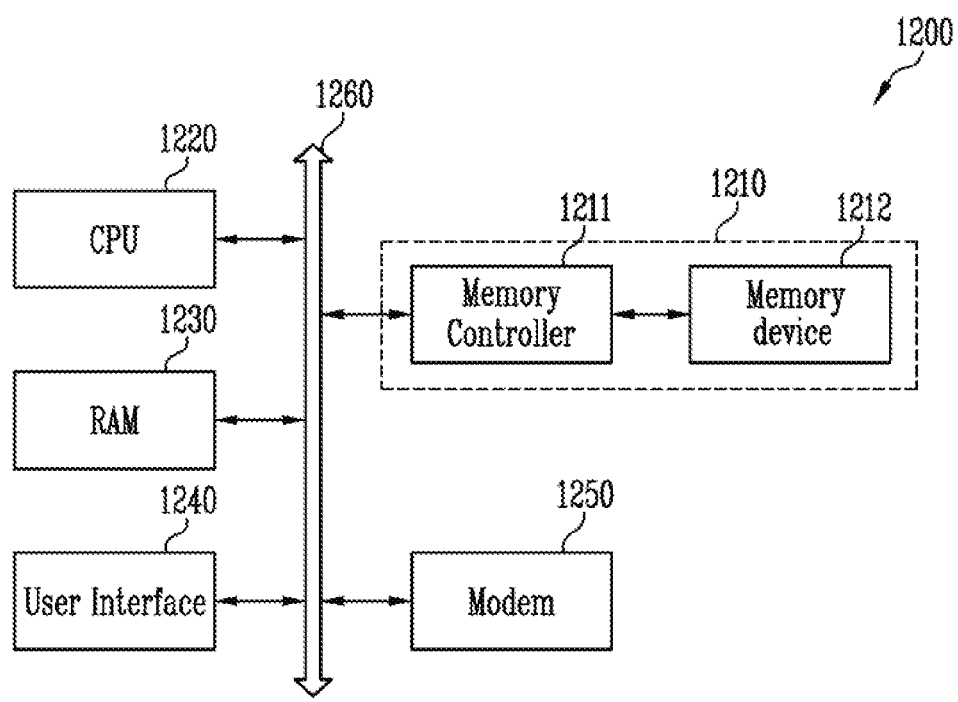
FIG. 9 is a block diagram illustrating a configuration of a computing system according to an embodiment of the present disclosure.

FIG. 9 is a block diagram illustrating a configuration of a computing system 1200 according to an embodiment of the present disclosure.

Referring to FIG. 9, the computing system 1200 according to an embodiment of the present disclosure may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may be configured of a memory device 1212 and a memory controller 1211. The memory device 1212 may include a resistive film overlap the depression of the dummy stack.

What is claimed is:

1. A semiconductor memory device comprising:
an insulating film passing through a dummy source structure;
a first dummy stack extending to overlap the insulating film and the dummy source structure, and including a depression overlapping the insulating film;
a resistive film overlapping the depression of the first dummy stack; and
a second dummy stack disposed on the first dummy stack to cover the resistive film.

2. The semiconductor memory device of claim 1, wherein the insulating film is formed lower than the dummy source structure.

3. The semiconductor memory device of claim 2, wherein a height of the insulating film is formed lower than a height of the dummy source structure.

4. The semiconductor memory device of claim 1, wherein the resistive film is formed to fill a groove defined in an upper surface of the first dummy stack by the depression.

5. The semiconductor memory device of claim 1, wherein the resistive film includes a metal.

6. The semiconductor memory device of claim 1, wherein the resistive film includes tungsten.

7. The semiconductor memory device of claim 6, wherein the resistive film further includes at least one of titanium and titanium nitride films.

8. The semiconductor memory device of claim 1, wherein the first dummy stack includes alternately stacked first material films and second material films, and
the first material films and the second material films have a substantially U-shaped bending portion overlapping the insulating film.

9. The semiconductor memory device of claim 8, wherein the second dummy stack includes alternately stacked third and fourth material films.

10. The semiconductor memory device of claim 9, wherein each of the first material films and the third material films includes silicon oxide, and
each of the second material films and the fourth material films includes silicon nitride.

11. The semiconductor memory device of claim 1, wherein the dummy source structure includes a first dummy source film, a first protective film, a sacrificial film, and a second dummy source film, which are sequentially stacked.

12. The semiconductor memory device of claim 1, wherein the dummy source structure includes a doped semiconductor film.

13. The semiconductor memory device of claim 1, further comprising:
a contact plug passing through the insulating film, the first dummy stack, the resistive film, and the second dummy stack.

14. The semiconductor memory device of claim 13, further comprising:
a substrate disposed under the insulating film and the first dummy stack;
a junction of a transistor formed in the substrate; and
an interconnection structure connecting the junction and the contact plug.

15. The semiconductor memory device of claim 1, further comprising:
a source structure spaced apart from the dummy source structure;
a first cell stack on the source structure;

a second cell stack disposed on the first cell stack;

a channel structure passing through the first cell stack and the second cell stack and contacting the source structure; and a memory film extending along a sidewall of the channel structure.

16. The semiconductor memory device of claim 15, wherein the source structure is disposed on substantially the same level as the dummy source structure.

17. The semiconductor memory device of claim 15, wherein the first dummy stack includes protrusions disposed on substantially the same level as the first cell stack on both sides of the depression, and the second dummy stack is disposed on substantially the same level as the second cell stack.

18. The semiconductor memory device of claim 15, wherein the source structure comprises:

a first source film surrounding a lower end of the channel structure;

a second source film between the first source film and the first cell stack; and a channel-contact film contacting the channel structure by passing through the memory film between the first source film and the second source film, and the memory film is extended between the channel structure and each of the first source film and the second source film.

19. The semiconductor memory device of claim 15, wherein the source structure includes a doped semiconductor film contacting a bottom surface of the channel structure.

* * * * *